(12) United States Patent
Yamasaki

(10) Patent No.: US 7,652,713 B2
(45) Date of Patent: Jan. 26, 2010

(54) IMAGE PICKUP APPARATUS

(75) Inventor: Ryo Yamasaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 567 days.

(21) Appl. No.: 09/994,744

(22) Filed: Nov. 28, 2001

(65) Prior Publication Data

US 2002/0121652 A1   Sep. 5, 2002

(30) Foreign Application Priority Data

Nov. 28, 2000   (JP)   ............................. 2000-361639

(51) Int. Cl.
   *G03B 13/00*   (2006.01)
   *H04N 5/232*   (2006.01)
(52) U.S. Cl. ...................... 348/345; 348/350; 348/353; 348/362
(58) Field of Classification Search ................ 348/302, 348/308, 362–364, 335, 336, 345–350, 353, 348/294, 301, 303, 311, 320–324; 250/208.1, 250/216, 208.2, 226; 396/89, 93, 101–114, 396/128, 137
See application file for complete search history.

(56) References Cited

U.S. PATENT DOCUMENTS

| 4,071,297 | A | * | 1/1978 | Leitz et al. | .................. | 356/4.04 |
| 4,441,123 | A | * | 4/1984 | Ochi | .......................... | 348/275 |
| 4,652,109 | A | * | 3/1987 | Tsunekawa | .................. | 396/234 |
| 5,151,583 | A | * | 9/1992 | Tokunaga et al. | ......... | 250/201.2 |
| 5,689,339 | A | * | 11/1997 | Ota et al. | ..................... | 356/401 |
| 5,760,852 | A | * | 6/1998 | Wu et al. | ...................... | 349/14 |
| 5,955,753 | A | | 9/1999 | Takahashi | .................... | 257/292 |
| 6,137,535 | A | * | 10/2000 | Meyers | ........................ | 348/340 |
| 6,393,219 | B1 | * | 5/2002 | Sensui | ......................... | 396/114 |
| 6,426,773 | B1 | * | 7/2002 | Suzuki | ......................... | 348/272 |
| 6,657,665 | B1 | | 12/2003 | Guidash | ..................... | 348/308 |
| 6,809,768 | B1 | * | 10/2004 | Merrill | ......................... | 348/308 |

(Continued)

FOREIGN PATENT DOCUMENTS

JP   63-13844 A   11/1994

(Continued)

OTHER PUBLICATIONS

CMOS Active Pixel Image Sensor, Sunetra Mendis, Sabrina Kemeny, Eric Fossum, IEEE Transactions on Electron Devices, vol. 41, No. 3, 1994, pp. 452-453.

*Primary Examiner*—Yogesh K Aggarwal
(74) *Attorney, Agent, or Firm*—Fitzpatrick, Cella, Harper & Scinto

(57) ABSTRACT

In an image pickup apparatus capable of executing image pickup and focus detection using the phase difference scheme by a solid-state image pickup element, accurate and quick focus detection using the phase difference scheme is realized. In addition, an image pickup apparatus capable of obtaining a high-quality image signal even in an image pickup mode is provided. Each pixel unit of an image pickup element includes first and second photoelectric conversion units for photoelectrically converting light components that have passed through different regions in the exit pupil of an image pickup optical system and is arranged such that the first sensitivity distribution by the first photoelectric conversion unit and the second sensitivity distribution by the second photoelectric conversion unit overlap in a region between the photoelectric conversion units.

7 Claims, 22 Drawing Sheets

U.S. PATENT DOCUMENTS 6,927,792 B1 * 8/2005 Mimura et al. ........... 348/223.1
6,933,978 B1 * 8/2005 Suda ......................... 348/345

FOREIGN PATENT DOCUMENTS

| JP | 9-46596 | 2/1997 |
| JP | 9-200784 A | 7/1997 |
| JP | 2000-232216 A | 8/2000 |
| JP | 2000-316117 A | 11/2000 |

* cited by examiner

IMAGE PICKUP APPARATUS

BACKGROUND OF THE INVENTION

1. Field of the Invention

The present invention relates to an image pickup apparatus which photoelectrically converts a light beam from an imaging optical system.

2. Related Background Art

In a digital camera, a subject image is exposed to a solid-state image pickup element such as a CCD or CMOS sensor for a desired time in response to depression of a release button. The resultant image signal that represents a still image of one frame is converted into a digital signal and subjected to predetermined processing such as YC processing, thereby obtaining an image signal having a predetermined format. A digital image signal representing a pickup image is stored in a semiconductor memory on each image basis. A stored image signal is read out and reproduced into a displayable or printable signal and output and displayed on a monitor or the like as needed.

Conventionally, focus detection in the image pickup optical system of a digital camera employs a contrast detection scheme using an image pickup apparatus. In such focus detection of a contrast detection scheme, generally, since the extremal value of contrast is obtained while slightly moving the on-axis position of the image pickup optical system, a considerably long time is required for focus adjustment until an in-focus state is obtained.

A focus detection method in which focus detection of a phase difference detection scheme used for, e.g., a single-lens reflex camera using a silver halide film is performed using the image pickup element of a digital camera has been proposed. In focus detection of the phase difference detection scheme, since the defocus amount can be obtained, the time required to obtain an in-focus state can be greatly shortened as compared to the contrast detection scheme. An example of such focus detection method has been proposed, in which a pair of photoelectric conversion units are prepared for each of microlenses that are two-dimensionally arrayed, a pixel unit formed from the pair of photoelectric conversion units is projected to the pupil of an image pickup optical system to separate the pupil, thereby executing focus detection of the phase difference scheme. In addition, an image pickup apparatus using, as a light-receiving means, a solid-state image pickup element described in Japanese Laid-Open Patent Application No. 9-46596 which can arbitrarily switch between addition and non-addition of a pair of photoelectric conversion unit outputs in one microlens has been proposed.

FIG. 39 is a sectional view showing a pixel unit in this image pickup apparatus.

Referring to FIG. 39, the pixel unit comprises a p-type well 124, gate oxide films 125 and 126, polysilicon layers 127 and 128, n-type layers 129 and 130 with a concentration capable of complete depletion, an $n^+$-type floating diffusion region (FD region) 131, and $p^+$-type surface layers 132 and 133. The FD region 131 is connected to the n-type layers 129 and 130 serving as first and second photoelectric conversion units, through the polysilicon layers 127 and 128 as the components of a transfer MOS transistor. The n-type layers 129 and 130 and $p^+$-type surface layers 132 and 133 form photoelectric conversion units as buried photodiodes. With this structure, a dark current generated on the surface can be suppressed. A color filter CF passes light in a specific wavelength range. A microlens μL efficiently guides a light beam from the image pickup optical system to the first and second photoelectric conversion units. The power of the microlens μL is set such that the exit pupil of the image pickup optical system and the pair of photoelectric conversion units in each pixel unit form images. Hence, the first and second photoelectric conversion units are designed to photoelectrically convert light components that have passed through different regions on the exit pupil.

FIG. 40 shows the state of exit pupil separation in the image pickup optical system by the first and second photoelectric conversion units. Referring to FIG. 40, a virtual image 1 is obtained when an iris ST is in a full-aperture state, and the aperture of the iris ST is viewed through rear lens groups grp3 and grp4. A hatched portion 2 indicates the first region on the exit pupil through which a light component that becomes incident on the first photoelectric conversion unit of a solid-state image pickup element 100 passes. A hatched portion 3 indicates the second region on the exit pupil through which a light component that becomes incident on the second photoelectric conversion unit of the solid-state image pickup element 100 passes. A small gap 4 is present between the first region 2 and the second region 3. A light component that has passed through this region is photoelectrically converted by neither of the first and second photoelectric conversion units. This is because the $n^+$-type FD region is inserted between the buried photodiodes formed from the n-type layers 129 and 130 and $p^+$-type surface layers 132 and 133, as shown in FIG. 38. At this portion, photoelectric conversion is not performed.

With the above arrangement, the solid-state image pickup element can independently transfer charges generated in the first and second photoelectric conversion units to the FD region 131. Only by adjusting the timings of transfer MOS transistors connected to the FD region 131, switching between addition and non-addition of signal charges of the two photoelectric conversion units is realized. Hence, in the image pickup mode, the signal charges of the first and second photoelectric conversion units are added and read, thereby photoelectrically converting the light components from the entire exit pupil of the image pickup optical system.

At the time of focus detection, the signal charges of the first and second photoelectric conversion units are independently read, thereby independently photoelectrically converting light components that have passed through different regions on the exit pupil of the image pickup optical system. Since the exit pupil of the image pickup optical system is separated into the first region 2 and second region 3, as shown in FIG. 40, the direction in which object images generates a phase shift due to defocus of the image pickup optical system is indicated by an arrow A. Hence, at the time of focus detection, a pixel array whose longitudinal direction is set in the direction indicated by the arrow A is set on the solid-state image pickup element, and a pair of image signals are generated from a pair of signal charges that are independently read, thereby detecting the phase shift between object images. To detect a phase shift, known correlation calculation is used. With the above arrangement, both image pickup and focus detection using the phase difference scheme are realized by the solid-state image pickup element 100.

In focus detection using the phase difference scheme, to accurately detect a phase shift from small to large defocus, the pair of object images in the direction of phase shift at an arbitrary defocus amount preferably have almost similar shapes. In this case, the phase shift amount between the pair of object images, which is calculated by known correlation calculation, and the defocus amount of the image pickup optical system can have an almost linear relationship. Hence, the defocus amount of the image pickup optical system can easily be derived from the phase shift amount.

Letting f(x,y) be the light amount distribution of a subject image and g(x,y) be the light amount distribution of an object image, a relationship (convolution) given by $$g(x, y) = \int_{-\infty}^{\infty}\int_{-\infty}^{\infty} f(x-a, y-b)h(a, b)\,da\,db \quad (1)$$

holds. In this case, h(x,y) is a transfer function representing a state wherein a subject image degrades in an image forming system, which is called a point spread function. Hence, to know the similarity between a pair of object images to be used for focus detection, the point spread function must be known.

In focus detection using the phase scheme, since the phase shift between a pair of object images is detected with an emphasis on their one-dimensional direction, the image system related to focus detection can be evaluated using not a point spread function but a line spread function as a one-dimensional function. Then, replacing light amount distribution of the subject image with f(x), replacing the light amount distribution of the object image with g(x), and using a line spread function L(a), equation (1) can be rewritten to $$g(x) = \int_{-\infty}^{\infty} f(x-a)L(a)\,da \quad (2)$$

When a pair of line spread functions in the phase shift direction at the time of defocus are known from equation (2), the similarity between the pair of object images can be known, and the basic defocus performance of focus detection using the phase difference scheme can be known. As is apparent from equation (2), the higher the similarity between the pair of line spread functions becomes, the higher the similarity between the pair of object images becomes.

For the intensity distribution of point images formed on the imaging surface by a given point light source that has passed through the exit pupil of the optical system, i.e., so-called point spread function, it can be regarded that the exit pupil shape is reduced and projected onto the imaging surface. Similarly, for the line spread function, it can be regarded that the exit pupil shape in the one-dimensional direction, i.e., a shape obtained by integrating the exit pupil shape in the one-dimensional direction is reduced onto the imaging surface through the microlens μL. In fact, due to the aberrations or manufacturing error in optical system, the imaging position or intensity changes depending on the passage position of a light component on the exit pupil and the shape of the line spread function slightly changes. However, since the purpose here is to know the similarity between the pair of line spread functions in the phase shift direction, the image pickup optical system and microlens μL will be simplified as ideal lenses without any aberrations. In addition, the sensitivity distributions of an infrared cut filter F1, low-pass filter LPF, color filter CF, and photoelectric conversion units and the S/N ratios of the photoelectric conversion units, which have been described in the prior art, will also be omitted.

The first and second regions 2 and 3 through which light components incident on the first and second photoelectric conversion units in FIG. 40 pass are integrated in the phase shift direction, i.e., the direction indicated by the arrow A. FIG. 41 is a graph showing the integration result in which an optical axis L1 is set at the origin. The abscissa represents the phase shift direction, and the ordinate represents the intensity. A first pupil intensity distribution 5 corresponds to the first region 2 on the exit pupil, and a second pupil intensity distribution 6 corresponds to the second region 3 on the exit pupil. Actually, the first and second pupil intensity distributions are reduced onto the imaging surface through the microlens μL to form line spread functions, but the similarity between the pair of line spread functions can be known from this graph. The defocus of the image pickup optical system is not taken into consideration here. For a small defocus, it can be regarded that the first and second pupil intensity distributions 5 and 6 are reduced in the abscissa direction and enlarged in the ordinate direction. For a large defocus, it can be regarded that the pupil intensity distributions are enlarged in the abscissa direction and reduced in the ordinate direction.

Referring to FIG. 41, the first and second pupil intensity distributions 5 and 6 have semi-circular shapes mirror-inverted in the phase shift direction, i.e., abscissa direction, and the similarity therebetween is low. Hence, it is known that the pair of line spread functions at an arbitrary defocus amount of a light beam passing through the first region 2 on the exit pupil of the image pickup optical system also have a low similarity in the phase shift direction. The line spread functions near the in-focus state are obtained by extremely reducing the pupil intensity distributions 5 and 6 in the abscissa direction and enlarging them in the ordinate direction. That is, the line spread functions have shapes like impulse waveforms, and therefore the similarity becomes high. However, when the image pickup optical system defocuses to some degree, the mirror-inverted semi-circular shapes conspicuously appear, and the similarity decreases.

When the image pickup optical system defocuses to some extent, and the similarity between the pair of line spread functions becomes low, as indicated by the first and second pupil intensity distributions 5 and 6 in FIG. 41, the pair of object images on the imaging surface nonuniformly deform in the phase shift direction because of the influence of the line spread functions, and the similarity becomes low. On the other hand, when the image pickup optical system is almost in the in-focus state, the line spread functions exhibit shapes like impulse waveforms. For this reason, the pair of object images on the imaging surface also exhibit almost similar shapes. The object images in the phase shift direction are equivalent to image signals obtained by pixel arrays whose longitudinal direction is set in the phase shift direction. Hence, when the image pickup optical system defocuses to some degree, the pair of image signals obtained by the first and second photoelectric conversion units have a low similarity and exhibit shapes inverted in the horizontal direction.

In focus detection using the phase difference scheme, the phase shift amount calculated by known correlation calculation, and the defocus amount of the image pickup optical system are made to have an almost linear relationship therebetween in a practical defocus range, and an expected defocus amount is calculated from the detected phase shift amount, thereby setting the image pickup optical system in the in-focus state. In the prior art, the phase shift amount and defocus amount have an almost linear relationship therebetween in a small defocus range wherein the pair of image signals have a high similarity. However, as the defocus amount increases, the similarity between the pair of image signals decreases, so the relationship between the phase shift amount and the defocus amount cannot be linear. When the image pickup optical system defocuses to some extent, the in-focus state cannot be obtained by executing focus detection only once. However, since an almost linear relationship is obtained in a small defocus range, the in-focus state can be obtained through the small defocus state by executing focus detection a plurality of number of times.

To do this, the iris ST of the image pickup optical system is designed as a two-aperture iris which has a pair of aperture portions in focus detection and retreats at the time of image pickup. In this case, since the characteristics of the pair of line spread functions in focus detection can be improved, focus detection need not be executed a plurality of number of times even in a large defocus state.

In the above prior art, however, especially when the image pickup optical system defocuses to some extent, focus detection must be executed a plurality of number of times. This makes it impossible to quickly adjust the focus state as an advantage of focus detection using the phase difference scheme.

When the above-described two-aperture iris having a pair of aperture portions is used, focus detection need not be executed a plurality of number of times even when the image pickup optical system defocuses to some extent. However, since the image pickup optical system must have an iris drive mechanism that causes the iris to retreat, the image pickup apparatus becomes bulky and expensive.

When the amount of light incident on the pair of photoelectric conversion units and the aperture ratio of the iris ST of the image pickup optical system have an almost linear relationship therebetween, and the luminance of the object and the sensitivity of the image pickup element are given, so-called APEX calculation to calculate the F-number and shutter speed according to the same procedure as in a film camera can be executed. In this case, since the exposure amount can be calculated using a general exposure meter, like a film camera, the phototaking operation is very easy. In the prior art, however, since the $n^+$-type FD region 131 is formed between the pn photodiodes 129 and 130, as shown in FIG. 39, the gap 4 where a light component is photoelectrically converted by neither of the first and second photoelectric conversion units is present. When the iris ST is set in a stopped-down-aperture state, the ratio of the gap 4 to the aperture region of the exit pupil increases. For this reason, the amount of light incident on the pair of photoelectric conversion units and the aperture ratio of the iris ST of the image pickup optical system have no linear relationship therebetween. As the F-number increases, the error increases. Hence, the exposure calculation using APEX also has an error, and no general exposure meter can be used.

Even from the viewpoint of image pickup, if a region where photoelectric conversion is not performed is present between the first and second photoelectric conversion units, an unnatural blur (double-line effect) readily occurs in an obtained image.

SUMMARY OF THE INVENTION

It is an object of the present invention to provide an image pickup apparatus capable of accurately and quickly executing focus detection from small to large defocus.

In order to achieve the above object, according to an aspect of the present invention, there is provided an image pickup apparatus, comprising an output unit which outputs a first electric signal corresponding to a first light flux included in light fluxes respectively from different areas dividing an exit pupil area of an imaging optical system, and a second electric signal corresponding to a second light flux different from the first light flux, included in the light fluxes; and a plurality of pixel units each including a first sensitive area for outputting the first electric signal, wherein the first sensitive area and the second sensitive area are arranged to each include a sensitive area where the first light flux and the second light flux overlap each other.

The above and other objects, features, and advantages of the present invention will become apparent from the following description in conjunction with the accompanying drawings.

DETAILED DESCRIPTION OF THE PREFERRED EMBODIMENTS

Figure 1:
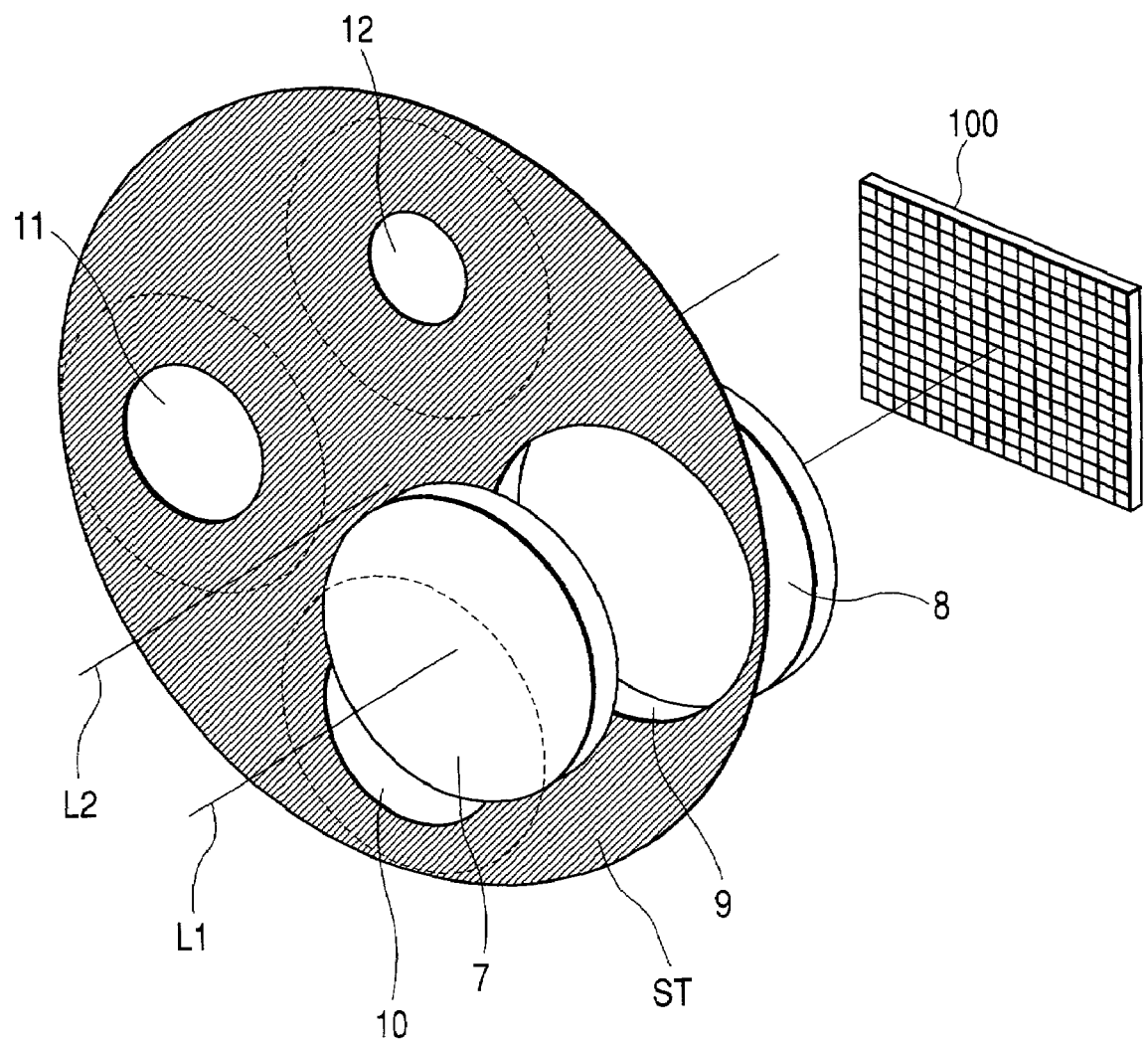
FIG. 1 is a perspective view of an image pickup optical system according to the first embodiment of the present invention.

Preferred embodiments to which the present invention is applied will be described below in detail with reference to the accompanying drawings.

The first embodiment will be described. The same reference numerals as in the prior art denote the same components in the first embodiment.

An image pickup optical system used in this embodiment will be described first.

Figure 36:
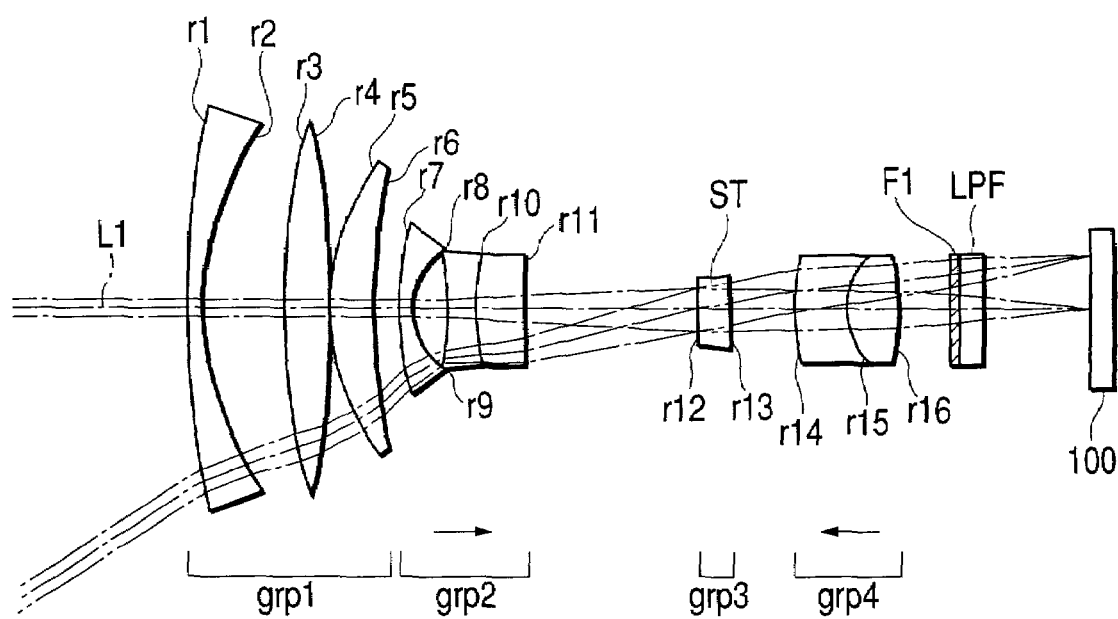
FIG. 36 is a view showing the structure of an image pickup optical system according to the first embodiment of the present invention.

FIG. 36 shows the structure of the image pickup optical system according to this embodiment.

This image pickup optical system is the zoom optical system of a digital color camera using a solid-state image pickup element 100. The image pickup optical system and camera body are integrated. The left side of FIG. 36 is the object side, and the right side is the image surface side. Referring to FIG. 36, the image pickup optical system is constituted by a positive first group (grp1) composed of a negative lens, positive lens, and positive lens, a negative second group (grp2) composed of a negative lens and a cemented lens of negative and positive lenses, an iris ST, a positive third group (grp3) comprised of a positive lens, and a fourth group (grp4) comprised of a cemented lens of negative and positive lenses. The image pickup optical system also includes an infrared (IR) cut filter F1, optical low-pass filter LPF, and optical axis L1 of the image pickup optical system.

As indicated by arrows in FIG. 36, as the focal length changes from the wide-angle state to the telephoto state, the negative second group grp2 moves to the image surface side, and simultaneously, the positive fourth group grp4 moves to the object side. The image pickup optical system has a lens drive mechanism (not shown). The negative second group grp2 is moved in the direction of optical axis using a motor and gear train to execute focus adjustment such that the object image is focused on the image pickup element 100.

The solid-state image pickup element 100 is a CMOS process compatible sensor (to be referred to as a CMOS sensor hereinafter) as one of amplification type solid-state image pickup apparatuses. A sensor of this type is disclosed in, e.g., IEEE TRANSACTIONS ON ELECTRON DEVICE, VOL 41, PP. 452-453, 1994. As a characteristic feature of the CMOS sensor, since the MOS transistors of the photoelectric conversion units and those of the peripheral circuits can be formed in the same process, the number of masks and the number of processes can be greatly decreased as compared to a CCD.

Taking advantage of this characteristic feature, two photoelectric conversion units are formed in one pixel unit, the numbers of floating diffusion regions (to be referred to as FD regions hereinafter) and source follower amplifiers formed for the two photoelectric conversion units are decreased from two to one, and the two photoelectric conversion units are connected to the FD region through a MOS transistor switch. Hence, charges in the two photoelectric conversion units can be simultaneously or independently transferred to the floating diffusion unit, and addition and non-addition of the signal charges in the two photoelectric conversion units can easily be switched only by adjusting the timings of transfer MOS transistors connected to the FD region. This structure makes it possible to switch between a first output mode in which photoelectric conversion output is provided from light components from the entire exit pupil of the image pickup optical system and a second output mode in which photoelectric conversion is provided from light components from part of the exit pupil of the image pickup lens. In the first output mode wherein signals are added at the pixel unit level, a signal with less noise can be obtained as compared to the scheme of reading and then adding signals.

Figure 37:
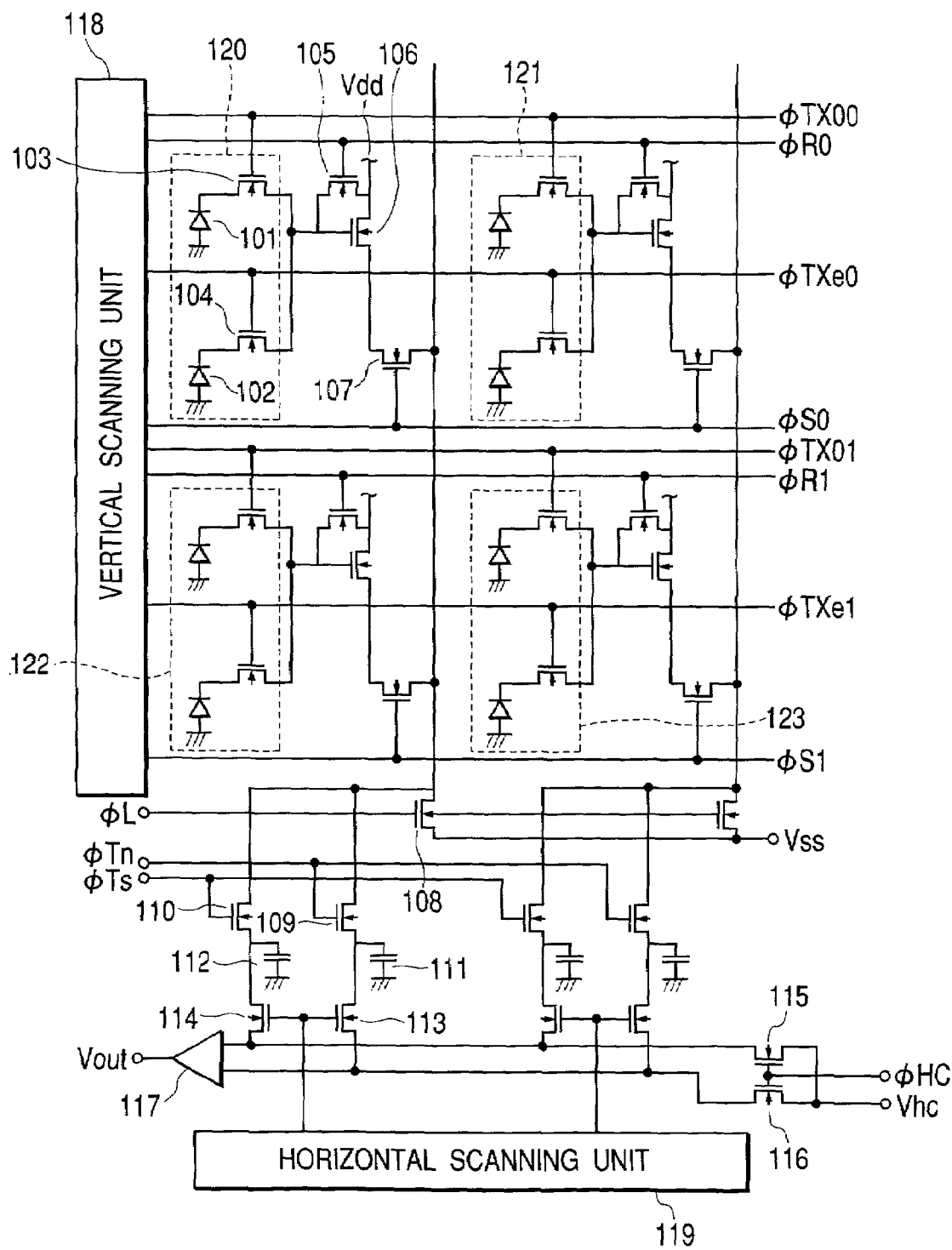
FIG. 37 is a circuit diagram of the area sensor unit of the solid-state image pickup element according to the first embodiment of the present invention.

FIG. 37 is a circuit diagram of an area sensor unit in the above-described image pickup element 100 capable of easily switching between addition and non-addition of signal charges in the two photoelectric conversion units. FIG. 37 shows a two-dimensional area sensor having 2 (columns)×2 (rows) pixel units. Actually, the number of pixels is increased to, e.g., 1,920 (columns)×1,080 (rows) to obtain a practical resolution. Referring to FIG. 37, the area sensor unit has first and second photoelectric conversion units 101 and 102 using pn photodiodes, transfer switch MOS transistors 103 and 104, a reset MOS transistor 105, a source follower amplification MOS transistor 106, a vertical selection switch MOS transistor 107, a source follower load MOS transistor 108, a dark output transfer MOS transistor 109, a bright output transfer MOS transistor 110, a dark output storage capacitance CTN 111, a bright output storage capacitance CTS 112, vertical transfer MOS transistors 113 and 114, vertical output line reset MOS transistors 115 and 116, a differential output amplifier 117, a vertical scanning unit 118, and horizontal scanning unit 119. A pixel unit 120 is thus formed. The pixel unit 120 is formed by putting the adjacent first and second photoelectric conversion units 101 and 102 together. This structure is also applied to remaining pixel units 121 to 123.

FIG. 1 is a perspective view of an image pickup apparatus including the image pickup optical system shown in FIG. 36.

Referring to FIG. 1, a front lens group 7 includes the first group (grp1) and second group (grp2) on the object side of the iris ST in the image pickup optical system shown in FIG. 36. A rear lens group 8 includes the third group (grp3) and fourth group (grp4) on the image side of the iris ST. An object image is formed on the image pickup element 100 by a light beam passing through the aperture of the iris ST. For the illustrative convenience, the infrared cut filter F1 and optical low-pass filter LPF are not illustrated. The iris ST rotates about an axis L2 and is selectively set at one of four positions by the driving force of a motor (not shown), thereby switching apertures 9 to 12.

The solid-state image pickup element 100 is a CMOS process compatible sensor (to be referred to as a CMOS sensor hereinafter) as one of amplification type solid-state image pickup apparatuses. In this embodiment, two photoelectric conversion units are formed in one pixel unit, as in the prior art. The numbers of floating diffusion regions (to be referred to as FD regions hereinafter) and source follower amplifiers formed for the two photoelectric conversion units are decreased from two to one, and the two photoelectric conversion units are connected to the FD region through a MOS transistor switch. Hence, charges in the two photoelectric conversion units can be simultaneously or independently transferred to the FD region, and the addition and non-addition of signal charges in the two photoelectric conversion units can easily be switched only by adjusting the timings of the transfer MOS transistors connected to the FD region.

This structure makes it possible to switch between a first output mode in which photoelectric conversion output is provided from light components from the entire exit pupil of the image pickup optical system and a second output mode in which photoelectric conversion is provided from light components from part of the exit pupil of the image pickup lens. In the first output mode wherein signals are added at the pixel unit level, a signal with less noise can be obtained as compared to the scheme of reading and then adding signals.

An area sensor unit in the above-described solid-state image pickup element 100 capable of easily switching between addition and non-addition of signal charges in the two photoelectric conversion units has the same circuit arrangement as that shown in FIG. 37. FIG. 37 shows a two-dimensional area sensor having 2×2 pixel units. Actually, the number of pixels is increased to, e.g., 1,920 (columns)× 1,080 (rows) to obtain a practical resolution, as in the prior art.

The structure of the pixel unit of this embodiment will be described next with reference to FIGS. 2 and 3.

Figure 2:
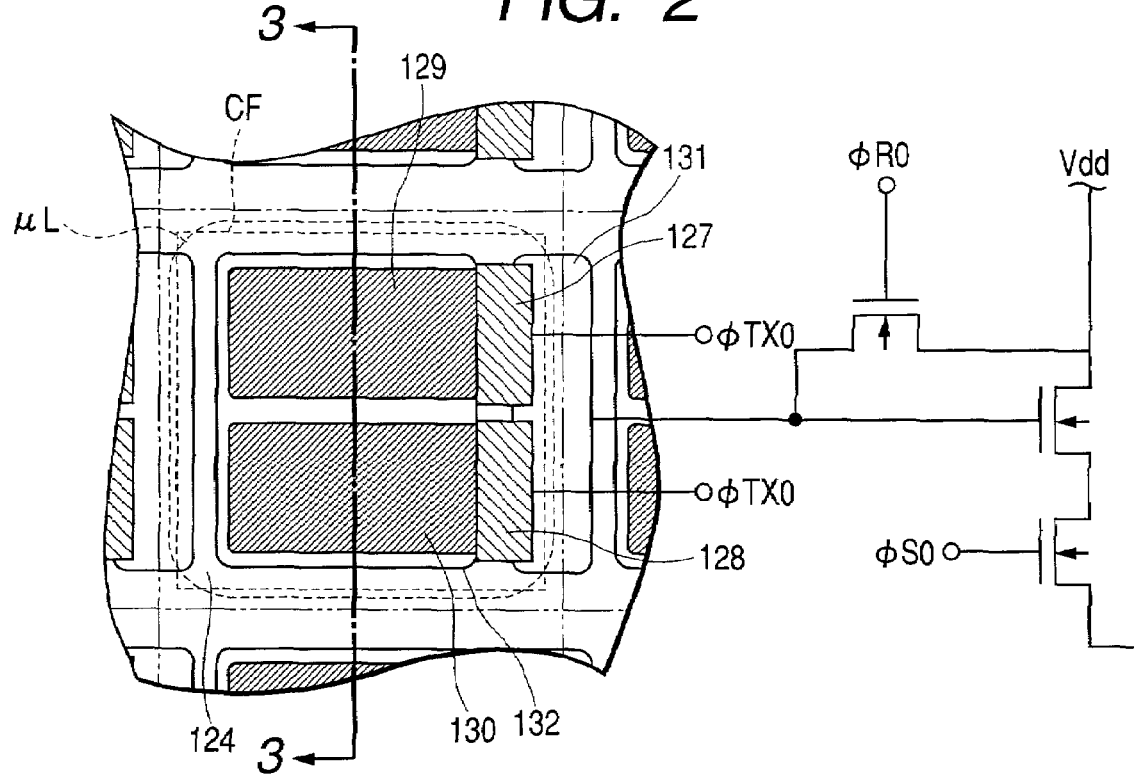
FIG. 2 is a plan view of a pixel unit of the area sensor unit of a solid-state image pickup element according to the first embodiment of the present invention.

FIG. 2 is an enlarged plan view of the pixel unit 120 shown in FIG. 37. FIG. 3 is a sectional view of the pixel unit shown in FIG. 2 taken along a line 3-3.

Figure 3:
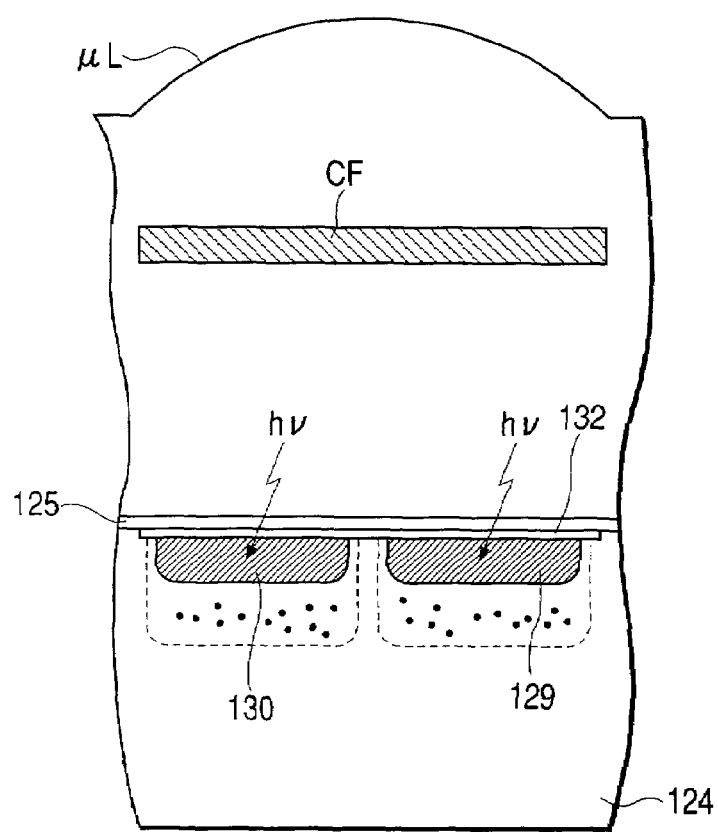
FIG. 3 is a sectional view of the pixel unit of the area sensor unit.

Referring to FIGS. 2 and 3, the pixel unit has a p-type well 124, gate oxide film 125, polysilicon layers 127 and 128, n-type layers 129 and 130 with a concentration capable of complete depletion, an n$^+$-type floating diffusion region (FD region) 131, and a p$^+$-type surface layer 132. The FD region 131 is connected to the first and second photoelectric conversion units 101 and 102 (n-type layers 129 and 130 in FIGS. 2 and 3) through the transfer MOS transistors 103 and 104 (polysilicon layers 127 and 128 in FIG. 2). The n-type layers 129 and 130 and surface p$_+$-type layer 132 form photoelectric conversion units as buried photodiodes. With this structure, a dark current generated on the surface can be suppressed.

A color filter CF passes light of a specific wavelength range. A microlens μL efficiently guides a light beam from the image pickup optical system shown in FIG. 38 to the first and second photoelectric conversion units 101 and 102. Referring to FIG. 2 that shows the plan view of the pixel unit, the gate oxide film 125, color filter CF, and microlens μL are arranged on the upper surface of the pixel unit having the components 124 to 132. However, the illustrative convenience, the gate oxide film 125 is not illustrated. The color filter CF and microlens μL are indicated by dotted lines in FIG. 2. The alternate long and two short dashed line is drawn to help understanding the almost square pixel unit having the first and second photoelectric conversion units. Such pixel units are arranged in a matrix form in a two-dimensional region to form the area sensor unit of the solid-state image pickup element 100.

The power of the microlens μL is set such that the exit pupil of the image pickup optical system shown in FIG. 36 and the pair of photoelectric conversion units 120 form images. Hence, the first and second photoelectric conversion units 101 and 102 are designed to photoelectrically convert light components that have passed through different regions on the exit pupil.

Figure 4:
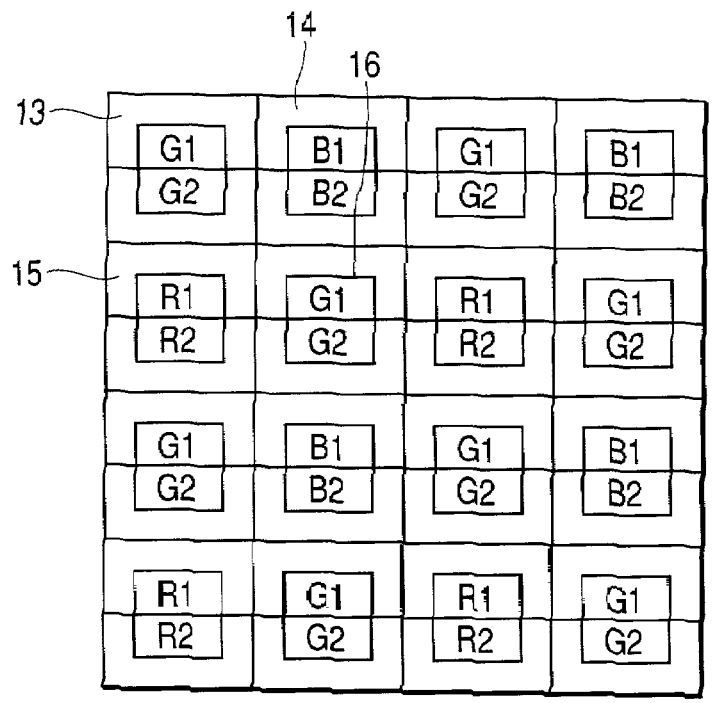
FIG. 4 is a partially enlarged schematic view of a color filter array.

FIG. 4 is an enlarged plan view showing only 4×4 pixel units of the solid-state image pickup element 100 shown in FIG. 1, which has 1,920×1,080 pixel units. The pixel units each including photoelectric conversion units and MOS transistors are arranged in an almost square pattern and arranged in a matrix form to be adjacent to each other. The pixel units 120 to 123 described above with reference to FIG. 37 are located in pixel units 11 to 14 in FIG. 4, respectively. One pixel unit has two photoelectric conversion units in proximity to each other.

The area sensor unit forms a so-called Bayer matrix in which R (red), G (green), and B (blue) color filters are alternately arranged on the pixel units to make one set from four pixel units. In this Bayer matrix, the number of G pixel units to which an observer readily becomes sensitive in seeing an image is increased as compared to the R and B pixel units, thereby improving the total imaging performance.

In an image pickup element of this type, generally, a luminance signal is mainly generated from G, and chrominance signals are generated from R, G, and B. As described above, each pixel unit has a pair of photoelectric conversion units. Symbol R, G, or B in FIG. 4 indicates that the pixel unit has a red, green, or blue color filter, and suffix 1 or 2 added to each of R, G, and B indicates distinction between the first and second photoelectric conversion units. For example, R1 indicates a first photoelectric conversion unit having a red color filter, and G2 indicates a second photoelectric conversion unit having a green color filter.

The occupation ratio of photoelectric conversion units in each pixel unit is low. To effectively use a light beam emerging from the image pickup optical system, a condenser lens must be prepared for each pixel unit to deflect light components that are going to reach positions other than the pair of photoelectric conversion units onto the photoelectric conversion units. The microlens μL shown in FIG. 3 is arranged to attain this function.

Figure 5:
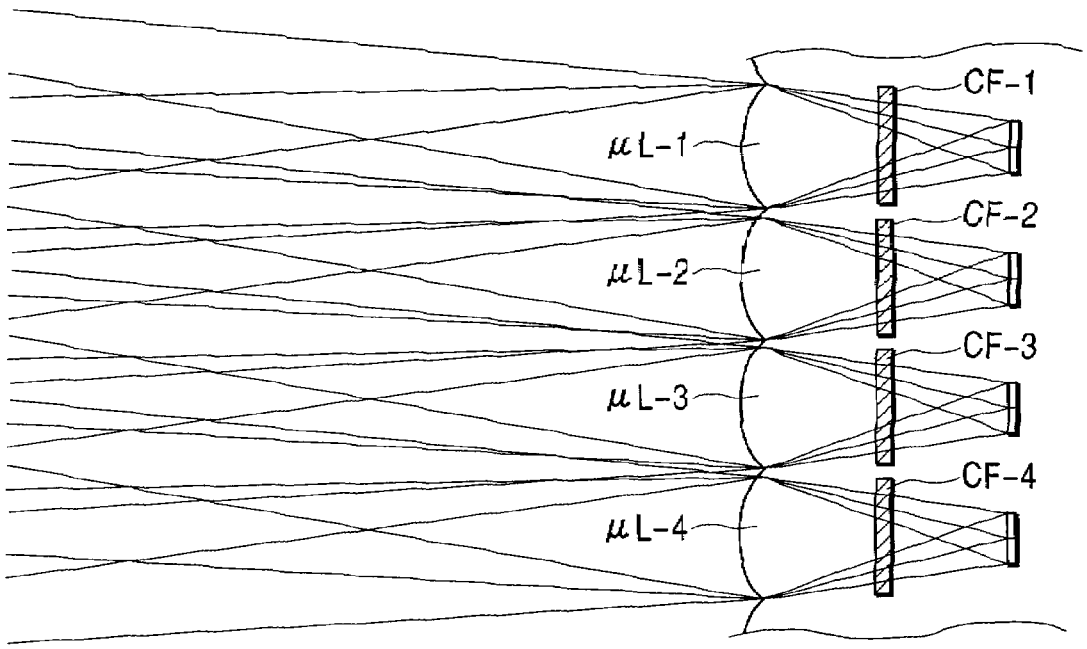
FIG. 5 is a view showing the projecting relationship between microlenses and light-receiving units.

FIG. 5 is a view showing the optical positional relationship between microlenses provided in front of the image pickup element and pairs of photoelectric conversion units. FIG. 5 is an enlarged view of a portion near the image pickup optical system L1.

Each of microlenses μL-1 to μL-4 is an axis symmetrical spherical or aspherical lens having an optical axis almost matching the center of a corresponding pixel unit and has a rectangular effective portion. The microlenses are densely arranged in a matrix while making the convex sides face the light incident side. The image pickup optical system shown in FIG. 1 is located on the left side of FIG. 5. A light beam emerging from the image pickup optical system becomes incident on the microlenses μL-1 to μL-4 first through the IR cut filter F1 and optical low-pass filter LPF. Color filters CF-1 to CF-4 are arranged on the rear side of the microlenses, through which only a desired wavelength range selectively reaches each photoelectric conversion unit.

The color filters form a Bayer matrix and include three types, R, G, and B, as described above. In the Bayer matrix, two of these types appear on the section. CF-1 and CF-3 are green transmitting color filters, and CF-2 and CF-4 are red transmitting color filters.

The power of each microlens is set such that the pair of photoelectric conversion units in each pixel unit in the image pickup element are projected to the exit pupil of the image pickup optical system. The projecting magnification is set such that the projected image of the pair of photoelectric conversion units becomes larger than the exit pupil of the image pickup optical system in the full-aperture state. An almost linear relationship is set between the amount of light incident on the pair of photoelectric conversion units and the aperture ratio of the iris ST of the image pickup optical system. In this case, when the object luminance and the sensitivity of the image pickup element are given, the F-number and shutter speed can be calculated according to the same procedure as in a film camera. That is, since the incident light amount is proportional to the aperture area of the iris, APEX calculation can be executed. Since the exposure amount can be calculated using a general exposure meter, like a film camera, the phototaking operation is very easy.

From the viewpoint of pupil projection accuracy, the image pickup optical system is preferably constituted as a telecentric system such that the incident angle of principal ray onto the solid-state image pickup element 100 becomes 0° in all microlenses on the solid-state image pickup element 100. However, it is difficult to form a complete telecentric system because of the requirement of size reduction and higher magnification of the zoom ratio. Hence, each microlens and pixel unit are slightly decentered, and the decenter amount is set as a function of the distance from the optical axis of the image pickup optical system to the pixel unit. Generally, by monotonically increasing the decenter amount in accordance with the distance, a pixel unit even at the frame periphery can be accurately projected onto the exit pupil of the image pickup optical system. In this embodiment, however, the microlenses are uniformly decentered for a block of 10×10 pixel units. With this structure, the microlens manufacturing process can be simplified, and the cost can be reduced.

Figure 6A:
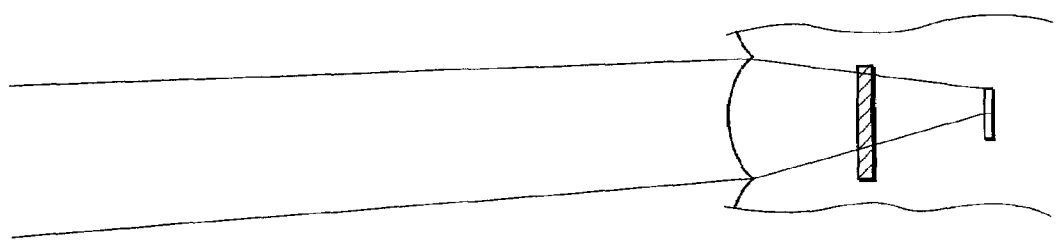
FIGS. 6A and 6B are schematic views showing a light component that becomes incident on a first photoelectric conversion unit and a light component that becomes incident on a second photoelectric conversion unit, respectively.
Figure 6B:
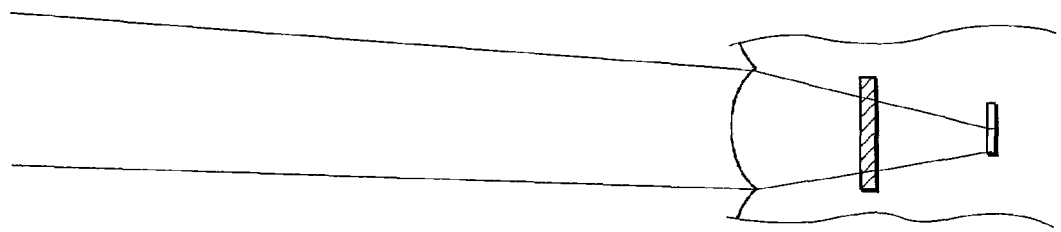

FIGS. 6A and 6B are views showing a light component that becomes incident on the first photoelectric conversion unit of a pixel unit shown in FIGS. 6A and 6B and a light component that becomes incident on the second photoelectric conversion unit, respectively, to help understanding.

Referring to FIG. 6A showing the light component incident on the first photoelectric conversion unit, the light component from the lower side of FIG. 6A becomes incident on the first photoelectric conversion unit. Referring to FIG. 6B showing the light component incident on the second photoelectric conversion unit, the light component becomes incident on the second photoelectric conversion unit from the upper side of FIG. 6B.

Figure 7:
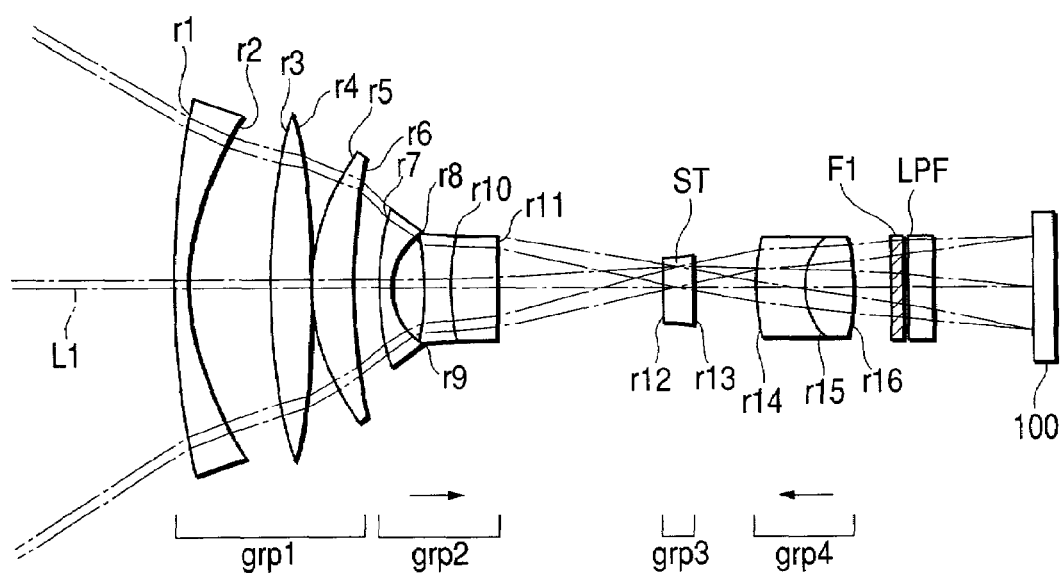
FIG. 7 is a view showing the structure of the phototaking optical system so as to indicate a light component that passes through the upper half portion of the exit pupil of the phototaking optical system.

In the entire image pickup element, light components become incident on the second photoelectric conversion units, as shown in FIG. 7. All light components to be incident on the second photoelectric conversion units in the area sensor unit pass through the upper half of the iris ST. On the other hand, light components incident on the first photoelectric conversion units in the entire image pickup element can be regarded as light components inverted in the vertical direction with respect to the optical axis L1 of the image pickup lens. With the above structure, when output signals from the first and second photoelectric conversion units of the image pickup element 100 are independently read, the light components that have passed through different exit pupil portions of the image pickup optical system can be photoelectrically converted. In the image pickup mode, the light components from the entire exit pupil of the image pickup optical system can be photoelectrically converted by adding the output signals from the first and second photoelectric conversion units, thereby realizing both image pickup and focus detection using the phase difference scheme by the solid-state image pickup element 100.

The characteristics of focus detection and those of image pickup in the image pickup apparatus of this embodiment will be described next. In focus detection using the phase difference scheme, to accurately detect a phase shift from small to large defocus, the pair of object images in the direction of phase shift in a practical defocus range preferably have almost similar shapes. In this case, the phase shift amount between the pair of object images, which is calculated by known correlation calculation, and the defocus amount of the image pickup optical system can have an almost linear relationship therebetween. Hence, the defocus amount of the image pickup optical system can be easily derived from the phase shift amount, and accurate and quick focus detection can be realized. In this embodiment as well, to know the similarity between the pair of object images, a pair of line spread functions in the phase shift direction will be checked.

As parameters used to derive the pair of line spread functions, the aberrations of the image pickup optical system, the aberrations of the IR cut filter F1, low-pass filter LPF, and microlens μL, the sensitivity distributions of the color filters CF and photoelectric conversion units, the S/N ratio of the photoelectric conversion units, the state of exit pupil separation, and the like are necessary. In this case, the image pickup optical system and microlens μL are assumed to be ideal lenses without any aberrations, and the S/N ratios of the IR cut filter F1, low-pass filter LPF, color filters CF, and photoelectric conversion units are omitted, thereby simplifying calculation. Hence, in this embodiment, the line spread functions will be obtained from the sensitivity distribution of the photoelectric conversion unit and the state of exit pupil separation.

Figure 8:
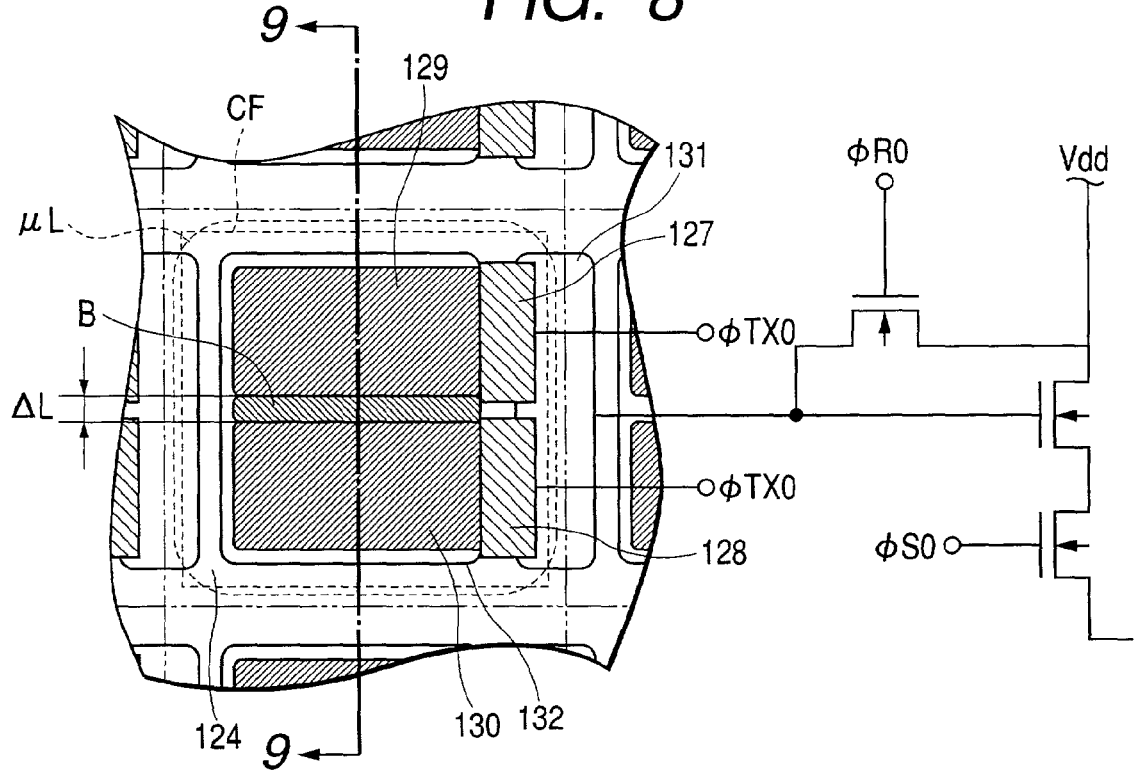
FIG. 8 is a plan view for explaining photoelectric conversion in the pixel unit of the area sensor unit.
Figure 9:
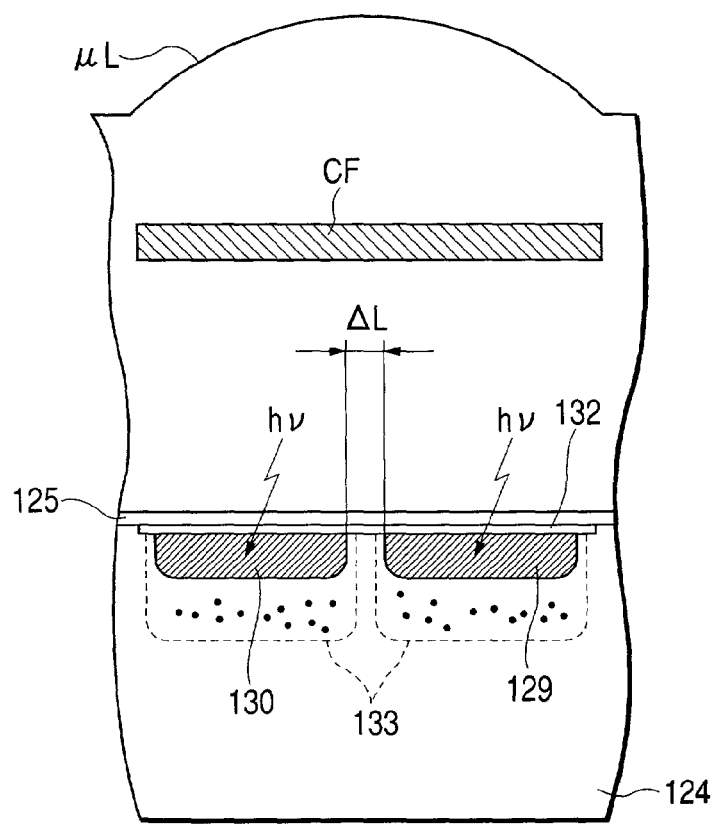
FIG. 9 is a sectional view for explaining photoelectric conversion in the pixel unit of the area sensor unit.

The sensitivity distribution of the photoelectric conversion units will be examined first. FIGS. 8 and 9 are views for explaining the sensitivity distribution of the photoelectric conversion units. FIG. 8 is the same as FIG. 2, i.e., the plan view of the pixel unit, and FIG. 9 is the same as FIG. 3, i.e., the sectional view of the pixel.

As shown in FIGS. 8 and 9, the pair of photoelectric conversion units, i.e., the n-type layers 129 and 130 indicated by hatched portions with diagonal lines upward to the right in FIGS. 8 and 9 are arranged at a small interval ΔL. A region between the n-type layers 129 and 130, i.e., a region B indicated by a hatched portion with diagonal lines downward to the right in FIG. 8 is formed from a p-type well. Portions 133 indicated by dotted lines in FIG. 9 are depletion layers under the n-type layers 129 and 130.

When light condensed by the microlens μL enters silicon as photons hυ, carriers are generated. Electrons which is one type of carriers will be examined. Electrons generated in an n-type layer are accumulated in the n-type layer. When electrons generated in a p-type well move to the end of a depletion layer due to diffusion, they move to an n-type layer due to the potential gradient in the depletion layer and are accumulated in the n-type layer. According to these rules, electrons generated in the p-type well at a position close to, e.g., the n-type layer 129 side are accumulated in the n-type layer 129, and vice versa. Electrons that are not trapped by the potential gradient do not act as effective charges and annihilate.

Assume that charges are generated in the region B. The possibility that charges move to a certain point due to diffusion depends on the distance. Hence, electrons generated in a neutral region (region in the semiconductor where no depletion layer is formed) near the n-type layer 129 are readily trapped by the n-type layer 129. Electrons generated near the n-type layer 130 are readily trapped by the n-type layer 130. Electrons generated at the middle point are trapped by either of n-type layers at a probability of ½.

The probability as a function of the distance becomes almost linear when the distance is sufficiently shorter than the diffusion length of electrons. The order of diffusion length is several millimeters. On the other hand, the distance, i.e., ΔL is on the order of several μm and can be regarded to be sufficiently short. Hence, in this embodiment, the probability that electrons generated in the region B will be trapped by the n-type layer 129 is represented as an almost linear function of the distance from the n-type layer 129. This also applies to the n-type layer 130.

In the region B, in addition to electrons that move to the n-type layers 129 and 130, a very small number of carriers move to the p-type well and do not act as effective photocharges. This phenomenon also occurs when the depletion layers 133 under the n-type layers 129 and 130 are partially connected near the region B. At this connected portion, the electron capture ratio is defined by drift (motion of electrons due to the potential gradient in the depletion layer). At an unconnected portion, however, the trap ratio of electron is defined by the same rules as described above.

Figure 10:
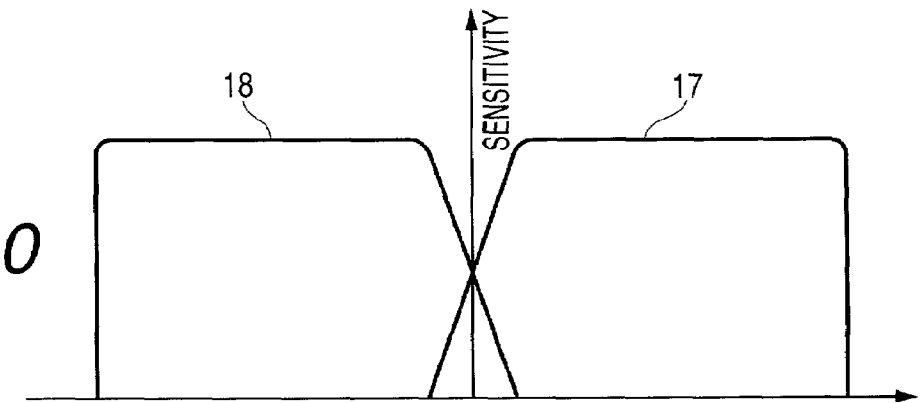
FIG. 10 is a graph showing the sensitivity distribution of the pair of photoelectric conversion units in focus detection.

Hence, the pair of photoelectric conversion units in the pixel unit whose sectional view is shown in FIG. 9 have a sensitivity distribution as shown in FIG. 10. Referring to FIG. 10, the ordinate indicates the sensitivity, the abscissa indicates the section direction, i.e., the horizontal direction of FIG. 9, and the origin matches the center of the pair of photoelectric conversion units. A sensitivity distribution 17 corresponds to the first photoelectric conversion unit 101 with the n-type layer 129, and a sensitivity distribution 18 corresponds to the second photoelectric conversion unit 102 with the n-type layer 130. The pair of sensitivity distributions 17 and 18 overlap at a portion corresponding to the region B shown in FIG. 8, i.e., near the ordinate in FIG. 10. That is, a crosstalk occurs in the pair of sensitivity distributions in the phase shift direction. The crosstalk portion at which the sensitivity distributions 17 and 18 overlap almost matches the interval ΔL between the n-type layers 129 and 130 shown in FIGS. 8 and 9.

The sensitivity distributions shown in FIG. 10 are sensitivity distributions in the one-dimensional direction along the section 9-9 in FIG. 8. The sensitivity distributions in the one-dimensional direction parallel to the section 9-9 do not change at any portion of the pair of photoelectric conversion units. Hence, even a light component incident on the region B shown in FIG. 10 is photoelectrically converted by one of the first and second photoelectric conversion units.

Figure 11:
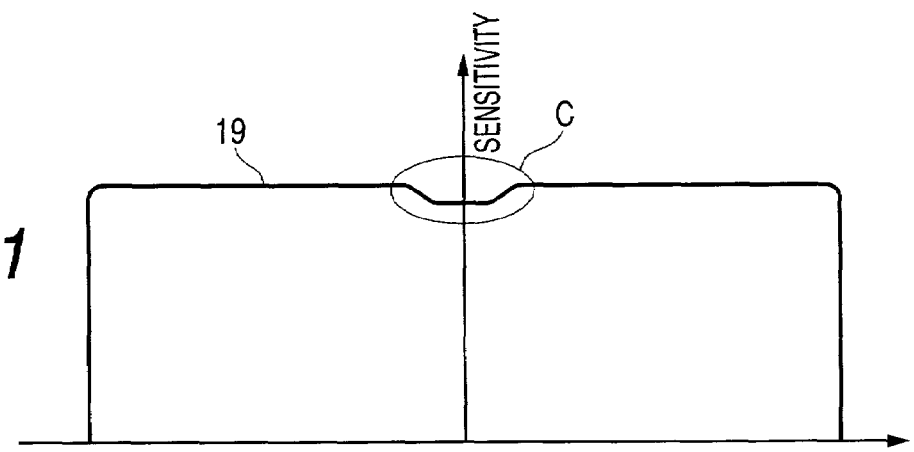
FIG. 11 is a graph showing the sensitivity distribution of the pair of photoelectric conversion units in the image pickup mode.

FIG. 11 shows a sensitivity distribution 19 as the sum of the sensitivity distributions 17 and 18 shown in FIG. 10. The sensitivity distribution 19 corresponds to the photoelectric conversion unit sensitivity distribution in the image pickup mode when the photoelectric conversion outputs from the first and second photoelectric conversion units 101 and 102 are added. The sensitivity distribution 19 exhibits a decrease in sensitivity at an encircled portion C. This portion corresponds to the region B shown in FIG. 8 and is generated due to the above-described reasons. However, since the degree of decrease is very small, the influence on an image signal is minimum.

This is a great improvement because the sensitivity at this portion is conventionally zero. Hence, in this embodiment, at the time of image pickup, the light components from the entire exit pupil of the image pickup optical system can be photoelectrically converted, the above-described APEX exposure calculation can almost be realized, and a high-quality image signal without any unnatural blur can be obtained.

Figure 12:
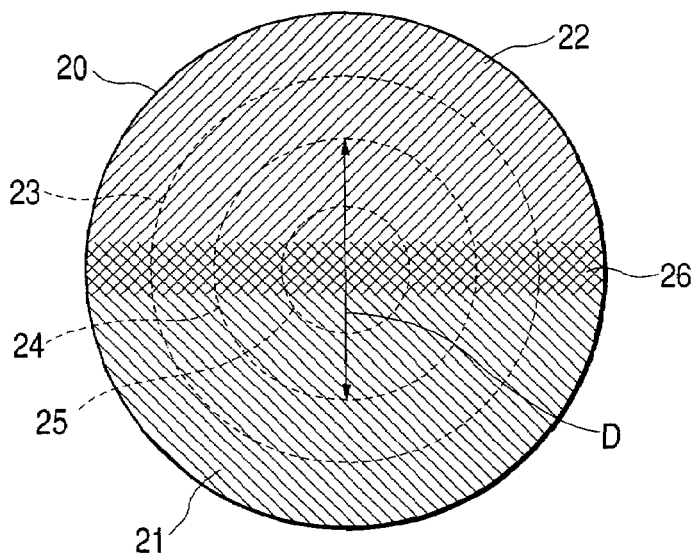
FIG. 12 is a schematic view showing exit pupil separation.

Exit pupil separation in the image pickup optical system will be described next. FIG. 12 is a view showing exit pupil separation in the image pickup optical system by the first and second photoelectric conversion units of this embodiment.

Referring to FIG. 12, a virtual image 20 is obtained when the iris ST is in the full-aperture state and when viewing the aperture 9 of the iris ST through the rear lens groups grp3 and grp4. A hatched portion 21 with diagonal lines downward to the right indicates a first region on the exit pupil through which a light component to be incident on the first photoelectric conversion unit of the solid-state image pickup element 100 passes. A hatched portion 22 with diagonal lines upward to the right indicates a second region on the exit pupil through which a light component to be incident on the second photoelectric conversion unit of the solid-state image pickup element 100 passes. Virtual images 23, 24, and 25 indicated by dotted lines correspond to the apertures 10, 11, and 12, respectively, and are obtained through the rear lens groups grp3 and grp4.

A double-headed arrow D indicates the direction of exit pupil separation, i.e., the direction in which a phase shift occurs between the pair of object images due to defocus. The first region 21 and second region 22 cross near a central region 26. This corresponds to the crosstalk portion at which the sensitivity distributions 17 and 18 overlap in FIG. 10, i.e., the region B in FIG. 8. That is, a light component that has passed through the central region 26 is also guided onto the region B in FIG. 8 through the microlens μL. Hence, to calculate, e.g., the pupil intensity distribution in the one-dimensional direction related to the first region 21, letting S(X) be a result obtained by integrating the hatched portion with diagonal lines downward to the right in FIG. 12 in the phase shift direction, and P(Y) be the sensitivity distribution of the first photoelectric conversion unit in the phase shift direction in FIG. 10, the integration result S(X) must be multiplied by the sensitivity distribution P(Y) corresponding to X of the integration result S(X). Finally, the pupil intensity distribution in the phase shift direction is calculated by $$H(X)=S(X)\cdot P(Y) \tag{3}$$

where Y is the abscissa of the sensitivity distribution shown in FIG. 10. One value Y is defined correspondingly to coordinates X in the phase shift direction on the exit pupil.

Figure 13:
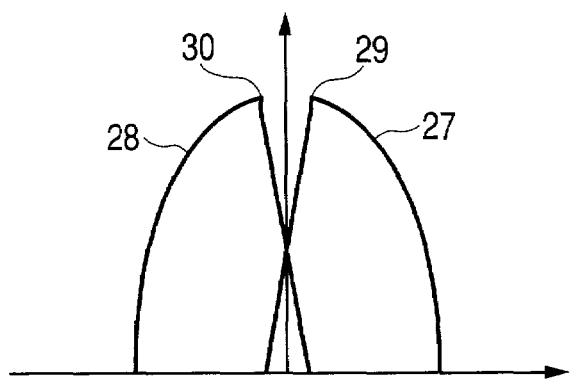
FIG. 13 is a graph showing a pair of pupil intensity distributions.

FIG. 13 is a graph showing pupil intensity distributions of this embodiment, which are calculated using equation (3). The origin matches the optical axis L1, the abscissa represents the phase shift direction, and the ordinate represents the intensity. A first pupil intensity distribution 27 corresponds to the first region 21 on the exit pupil, and a second pupil intensity distribution 28 corresponds to the second region 22 on the exit pupil. Actually, the first and second pupil intensity distributions are reduced onto the imaging surface through the microlens μL to form line spread functions. However, the purpose here is to know the similarity between the pair of line spread functions, and it can be known from this graph. The defocus of the image pickup optical system is not taken into consideration here. For a small defocus, it can be regarded that the first and second pupil intensity distributions 27 and 28 are reduced in the abscissa direction and enlarged in the ordinate direction. For a large defocus, it can be regarded that the pupil intensity distributions are enlarged in the abscissa direction and reduced in the ordinate direction.

Referring to FIG. 13, the first and second pupil intensity distributions 27 and 28 are affected by the crosstalk of the sensitivity distributions 17 and 28 shown in FIG. 10 and overlap each other for a region of angled portions 29 and 30 located below the center. However, since the tails of each sensitivity distribution extend in the horizontal direction, the similarity improves as compared to the first and second pupil intensity distributions 5 and 6 in the prior art. For the actual line spread functions, since the first and second pupil intensity distributions 27 and 28 are expected to have round angled portions 29 and 30 and moderately extending tails as a whole because of the aberrations in the optical system and the effect of the low-pass filter LPF, the similarity between the pair of line spread functions is estimated to further improve.

A pixel unit near the optical axis L1 wherein the optical axis of the microlens μL and the center of the pixel unit are not decentered has been described above. This also applies to the peripheral portion of the solid-state image pickup element 100.

Hence, in this embodiment, line spread functions having a high similarity can be obtained from small to large defocus. In addition, since the pair of object images to be used to detect a phase shift are given by the convolution of the line spread functions shown in FIG. 13 and the light amount distribution in the phase shift direction of the subject images on the basis of equation (2), image signals having high quality and high similarity for focus detection can be obtained.

As is apparent from the above description, to obtain a pair of object images having a high similarity, the similarity between a pair of line spread functions is important. In this embodiment, the structure of the pair of photoelectric conversion units is improved to generate a crosstalk in the sensitivity distributions in the phase shift direction, thereby improving the similarity between the pair of line spread functions. The crosstalk amount of the sensitivity distributions in the phase shift direction is determined by the distance $\Delta L$ between the n-type layers 129 and 130, as described with reference to FIGS. 8 to 10. The similarity between the pair of line spread functions changes by the amount $\Delta L$. Hence, the value $\Delta L$ must be optimized on the basis of the widths of the n-type layers 129 and 130 in the phase shift direction and the F-number of the image pickup optical system in focus detection.

Figure 14:
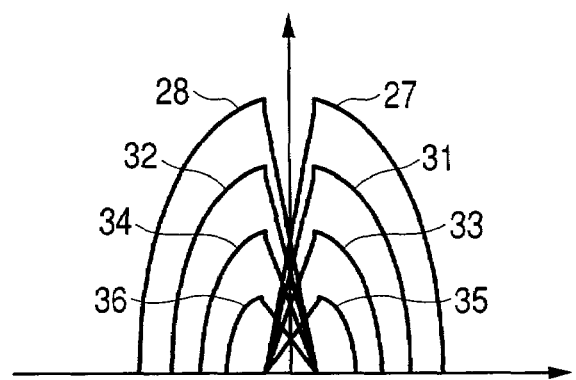
FIG. 14 is a graph showing pairs of pupil intensity distributions at a plurality of apertures of an iris ST.

FIG. 14 is a graph showing pairs of pupil intensity distributions obtained by changing the F-number of the image pickup optical system. Line spread functions 31, 33, and 35 correspond to the first region 21, and line spread functions 32, 34, and 36 correspond to the second region 22. The line spread functions 31 and 32 correspond to the virtual image 23 (aperture 10 in FIG. 1) in FIG. 12, the line spread functions 33 and 34 correspond to the virtual image 24 (aperture 11 in FIG. 1) in FIG. 12, and the line spread functions 35 and 36 correspond to the virtual image 25 (aperture 12 in FIG. 1) in FIG. 12.

As is apparent from FIG. 14, when the F-number of the image pickup optical system is changed, the similarity between the pair of line spread functions changes. The line spread functions 31 and 32 or 33 and 34 corresponding to the aperture 10 or 11 of the iris ST have a high similarity. In focus detection using the phase difference scheme, as the F-number of the image pickup optical system decreases, the base length increases, accurate defocus detection becomes possible, and the limit performance at a low luminance improves. Hence, in this embodiment, focus detection is performed at the aperture 10 of the iris ST.

If focus detection is to be executed using the brighter aperture 9, the interval $\Delta L$ between the n-type layers 129 and 130 shown in FIG. 9 is increased to improve the similarity between the pair of line spread functions 27 and 28. In this case, however, since the region indicated by the circle C in FIG. 11 where the sensitivity distribution of the photoelectric conversion units in the image pickup mode decreases becomes large, the APEX exposure calculation readily generates an error. In addition, the image signal in the image pickup mode readily generates an unnatural blur. In this embodiment, the interval $\Delta L$ between the n-type layers 129 and 130 and the F-number in focus detection are determined in consideration of the above facts.

Figure 16:
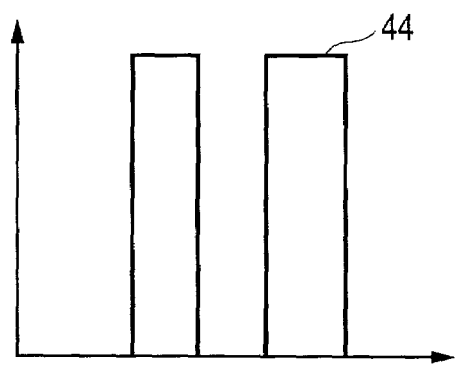
FIG. 16 is a graph showing a subject image light amount distribution in a one-dimensional direction.

The pair of object images in this embodiment will be calculated below. To do this, a subject image is defined first. FIG. 16 is a graph showing a subject image light amount distribution in the phase shift direction. A subject image light amount distribution 44 is formed from two rectangular waves. This light amount distribution is obtained using two white chart lines on a black background. Hence, the rectangular waves have extreme leading and trailing edges.

Figure 17A:
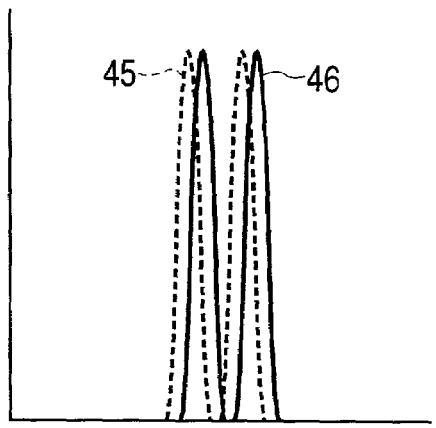
FIGS. 17A, 17B and 17C are graphs showing a pair of image signals by defocus.
Figure 17B:
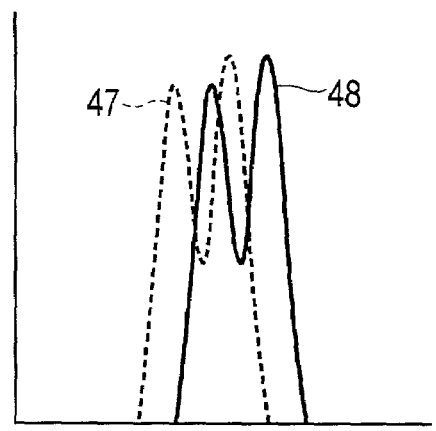
Figure 17C:
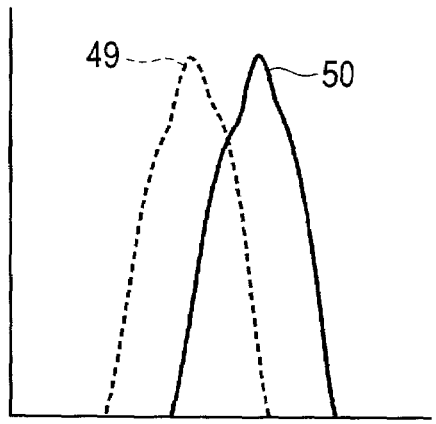

FIGS. 17A to 17C show a pair of object images obtained by executing convolution of equation (2) for the subject images shown in FIG. 16 and line spread functions in the defocus state, which are converted from the pupil intensity distributions 31 and 32 in FIG. 14. FIG. 17A shows a case wherein the image pickup optical system defocuses in the far-focus direction by 1 mm. An object image 45 corresponds to the first region 21 on the exit pupil, and an object image 46 corresponds to the second region 22.

FIGS. 17B and 17C show cases wherein the image pickup optical system defocuses in the far-focus direction by 3 mm and 5 mm Object images 47 and 49 correspond to the first region 21 on the exit pupil, and object images 48 and 50 correspond to the second region 22. As is apparent from FIGS. 17A to 17C, the similarity between the pair of object images is high when the defocus amount is 1 or 3 mm, and the phase shift can be accurately calculated by known correlation calculation or the like.

When the defocus amount is 5 mm, the similarity slightly decreases. However, the larger the defocus amount becomes, the degree of blur of the pair of object images increases. Hence, a phase shift can be sufficiently obtained using correlation calculation.

Figure 18:
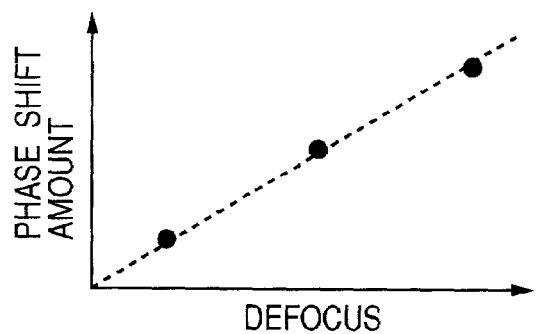
FIG. 18 is a graph showing the relationship between a defocus amount and a phase shift.

FIG. 18 is a graph showing the relationship between the defocus amount of the object images in FIGS. 17A to 17C and a phase shift amount detected by known correlation calculation.

Solid dots 51, 52, and 53 plotted in FIG. 18 correspond to FIGS. 17A, 17B, and 17C, respectively. As is apparent from FIG. 18, in a practical defocus range, the defocus amount and phase shift amount have an almost linear relationship therebetween. Hence, the defocus amount of the image pickup optical system can easily be calculated on the basis of the detected phase shift amount.

As is apparent from the above result, in this embodiment, focus detection can be executed using a pair of object images having a high similarity in a practical defocus range, and consequently, accurate and quick focus detection can be realized. In the image pickup mode, a high-quality image signal can be obtained as in a normal solid-state image pickup element designed to photoelectrically convert all light components from the exit pupil.

An actual focus detection method will be described. When the image pickup optical system defocuses, the phase of an object image shifts in the direction of pupil separation. A focus detection region is set to have a rectangular shape long in the direction of pupil separation of the image pickup optical system.

Figure 15:
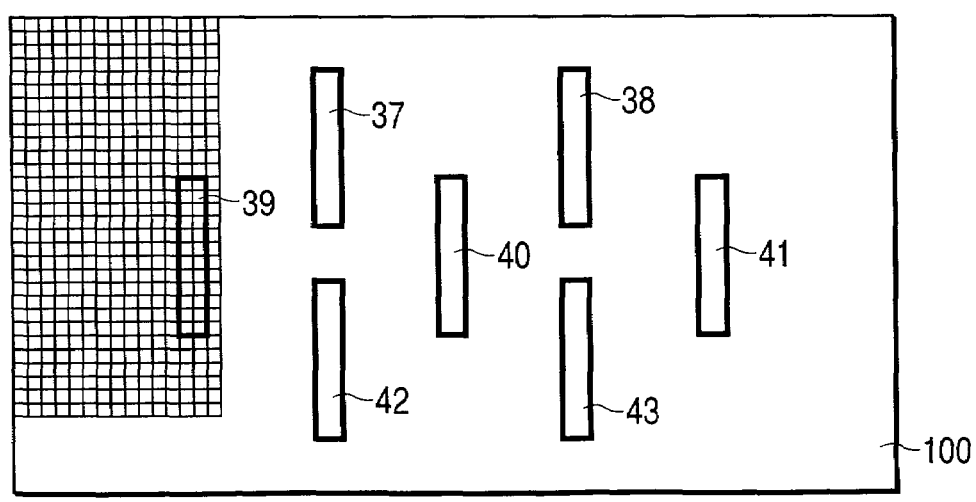
FIG. 15 is a schematic view showing focus detection regions on the image pickup element.

FIG. 15 is a view for explaining focus detection regions on the area sensor unit of the solid-state image pickup element 100. Regions 37 to 43 indicated by bold rectangles in FIG. 15 are set as phase shift regions in advance. Pixel units arranged in a matrix are illustrated only near the focus detection region 39 in FIG. 15, though they are not illustrated (omitted) for the remaining regions.

In the above arrangement, a phase shift amount is detected by known correlation calculation serving as a phase shift amount detection means using image signals obtained by independently reading output signals from the first and second photoelectric conversion units. and the focus of the image pickup optical system is adjusted. For the F-number of the image pickup optical system in the focus detection mode, the aperture 10 of the iris ST is used, as described above. In addition, each focus detection region is formed from two sets of pixel arrays to extract image signals of the respective colors (green, red, and blue) from the image pickup element 100 having a Bayer matrix described with reference to FIG. 4, and a detailed description thereof will be omitted.

In the image pickup mode, the output signals from the first and second photoelectric conversion units are added at the pixel unit level using the apertures 9 to 12 of the iris ST. In this case, a high-quality image with a high S/N ratio at the same level as that of an image obtained by a conventional solid-state image pickup element which is designed to obtain an image using all light components from the pupil of the image pickup optical system can be obtained without any unnatural image blur.

Figure 19:
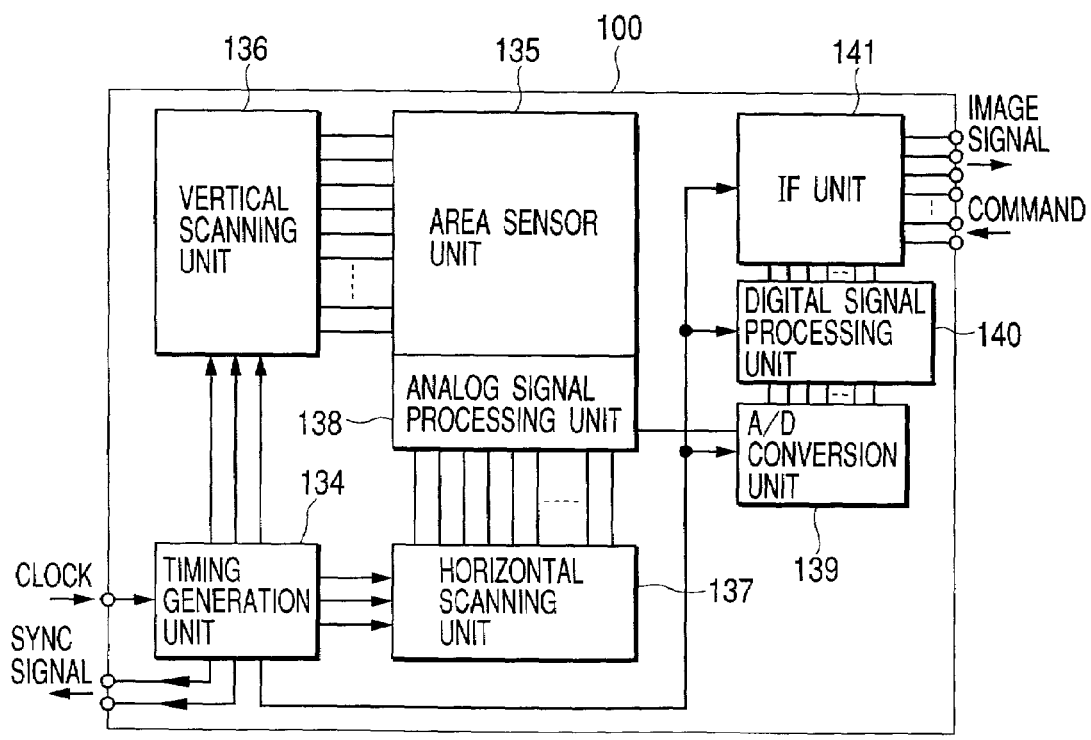
FIG. 19 is a block diagram showing the internal arrangement of the image pickup element, including peripheral circuits.

The circuit arrangement of the electrical system of this embodiment will be described next. FIG. 19 is a block diagram showing the internal arrangement of the image pickup element 100, including peripheral circuits. The image pickup element 100 has a timing generation unit 134, an area sensor unit 135, vertical and horizontal scanning units 136 and 137 for selecting a pixel output, an analog signal processing unit 138, an A/D conversion unit 139 for executing A/D conversion, a digital signal processing unit 140 for converting a digital signal into an output signal, and an I/F unit 141 for outputting a digital image signal to an external device and receiving command data from an external device. The area sensor unit 135 is the above-described CMOS sensor.

The timing generation unit 134 generates a timing signal to be used to read an image signal photoelectrically converted by each photoelectric conversion unit on the basis of a master clock, i.e., an external reference frequency. The vertical and horizontal scanning units 136 and 137 execute predetermined scanning control in accordance with the timing signal to read out charges.

The timing generation unit 134 outputs vertical and horizontal sync signals to the outside and supplies a sync signal to a system that requires the timing signal outside the image pickup element.

The analog signal processing unit 138 executes noise reduction processing, amplification processing, gamma processing, and clamp processing for the image signal read from the area sensor unit 135 and outputs the image signal to the A/D conversion unit 139. The A/D conversion unit 139 converts the image signal into a digital signal and outputs the digital signal. The digital signal processing unit 140 outputs the image signal converted into the digital signal by the A/D conversion unit 139 to the I/F unit 141. The I/F unit 141 outputs the digital image signal output from the A/D conversion unit 139 to the outside of the image pickup element 100.

The image pickup element 100 can control the mode of the image pickup element 100, the output signal format, and the signal output timing in correspondence with an external command. When a predetermined external command is supplied to the I/F unit 141 to obtain a picked-up image or a focus detection image, the components are controlled to execute control corresponding to the command received by the I/F unit 141.

Figure 20:
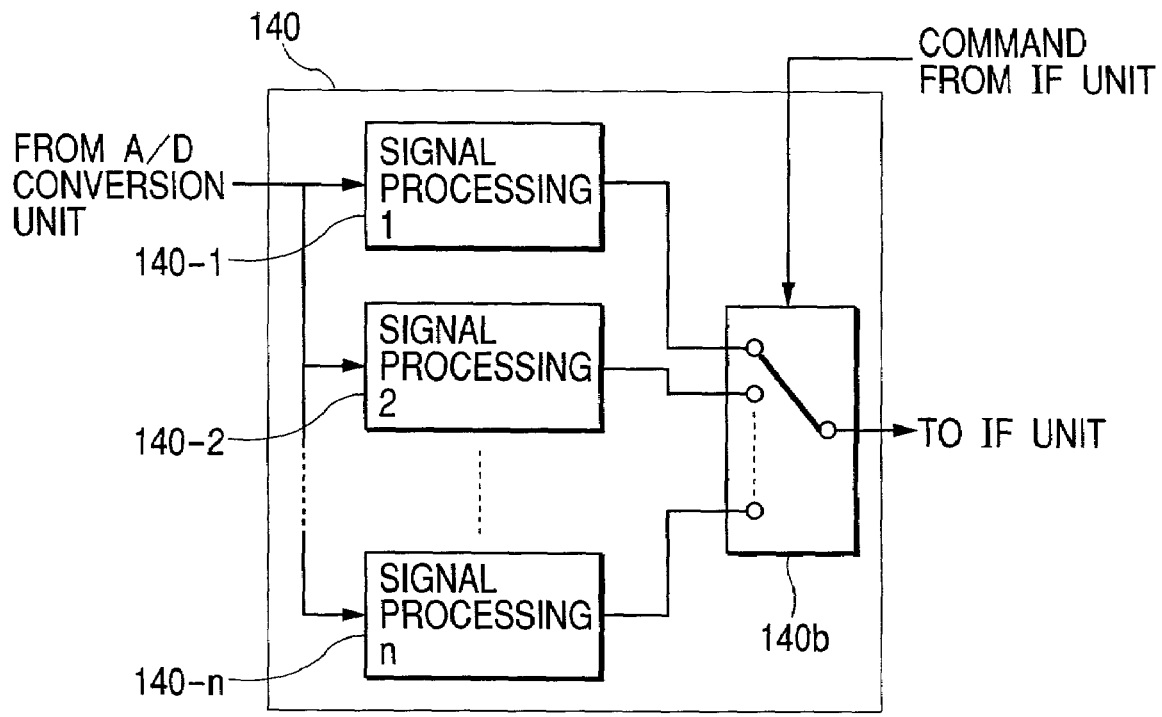
FIG. 20 is a block diagram for explaining an output position designation command.

FIG. 20 is a block diagram showing the internal arrangement of the digital signal processing unit 140. To easily obtain a focus detection image, output position designation commands are prepared as signal processing 1 (140-1), . . . , signal processing n (140-n). Each of the focus detection regions 37 to 43 shown in FIG. 15 corresponds to one of the output positions. When an arbitrary focus detection region is designated, a pair of focus detection image signals in first and second photoelectric conversion units are obtained.

For the image pickup mode, similarly, a specific image pickup command is designated to the digital signal processing unit 140, thereby obtaining an image pickup image signal obtained by adding image signals from the first and second photoelectric conversion units in an image pickup region of the analog signal processing unit 138 at the pixel unit level.

A line including a focus detection region is designed to output an image whose charge accumulation level is optimized for focus detection. To obtain an appropriate signal level in a focus detection region, an electronic shutter can be set for each focus detection region.

Generally, in a CCD-type image pickup element, all pixels use the same charge accumulation time. However, the image pickup element 100 of this embodiment can easily take a structure for executing a read-out on each pixel basis, on each line basis, or on each block basis by taking advantage of the characteristic feature of the CMOS sensor. In addition, the start and end of accumulation time can be changed for each read-out unit. Here, the charge accumulation time is changed for each vertical line, so the image in a focus detection region can effectively use the A/D conversion range.

In this embodiment, only seven focus detection regions are set. Instead of selecting a region from these preset regions, some regions may be arbitrarily designated from several hundred regions by preparing a pointing device such as a track ball. In this case, focus detection in a wider region in the image pickup region can be executed.

Figure 21:
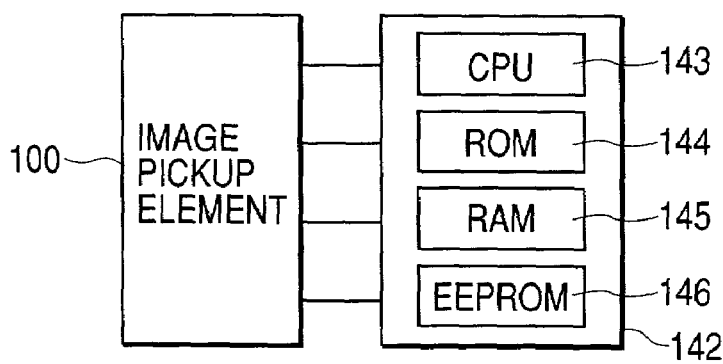
FIG. 21 is a block diagram of the electrical system of the image pickup apparatus.

FIG. 21 is a block diagram showing the electrical circuit of the image pickup apparatus according to this embodiment.

Referring to FIG. 21, a microcomputer 142 is connected to the image pickup element 100 shown in FIG. 19 through the I/F unit 141. The image pickup element 100 is controlled by supplying a predetermined command from the microcomputer 142 to the I/F unit 141. The microcomputer 142 has a CPU (Central Processing Unit) 143, ROM 144, RAM 145, and EEPROM 146. Various kinds of operations are performed in accordance with programs stored in the ROM 144. The EEPROM 146 stores information such as image signal correction processing information in advance.

Finally, signal processing for focus detection using a pair of image signals will be described.

Figure 22:
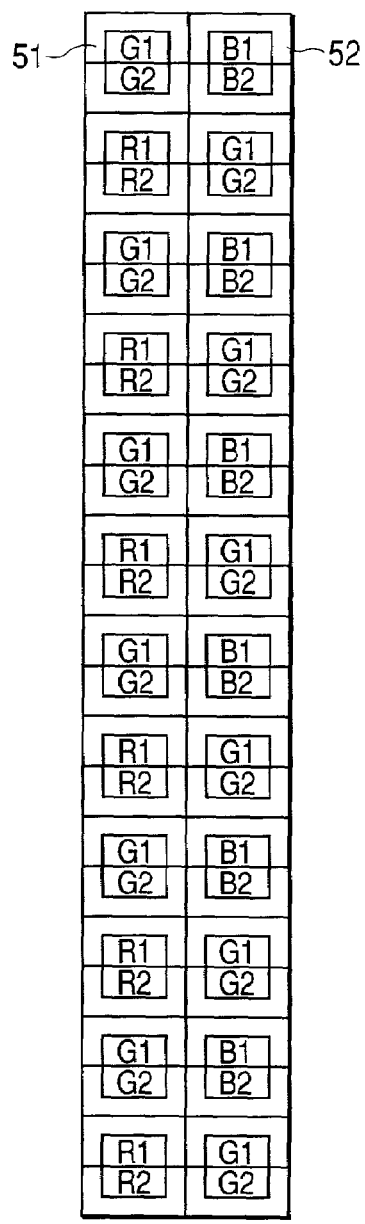
FIG. 22 is a partially enlarged schematic view showing a focus detection region.

Focus detection is executed using the aperture 10 shown in FIG. 1 for the F-number of the image pickup optical system, as described above. FIG. 22 is an enlarged view of the focus detection region 37. As shown in FIG. 22, the focus detection region 37 has pixel arrays 51 and 52 each formed from 12 pixel units. In fact, the focus detection region 37 is formed from a number of pixels, e.g.,300 (rows)×2 (columns) pixels. For the illustrative convenience, only 12 (rows)×2 (columns) pixel units are illustrated here.

Since the color filters of the area sensor unit 135 form a Bayer matrix, two types of color filters are alternately arranged in each pixel array. For focus detection, pixel units in the pixel arrays are classified depending on the type of color filter, and a pair of image signals as signals from the first and second photoelectric conversion units are generated from each pixel unit class. Hence, a total of four pairs of image signals are generated from the focus detection region 37.

Figure 23:
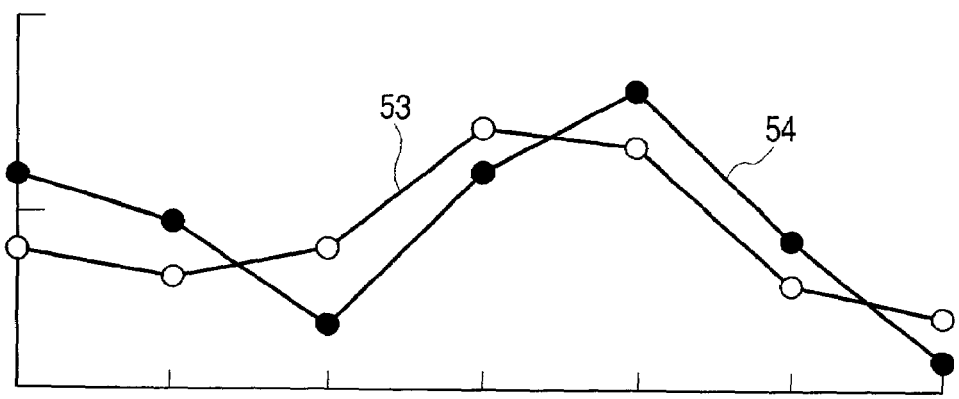
FIG. 23 is a graph showing a pair of image signals in light-receiving units having green color filters in the pixel array.
Figure 24:
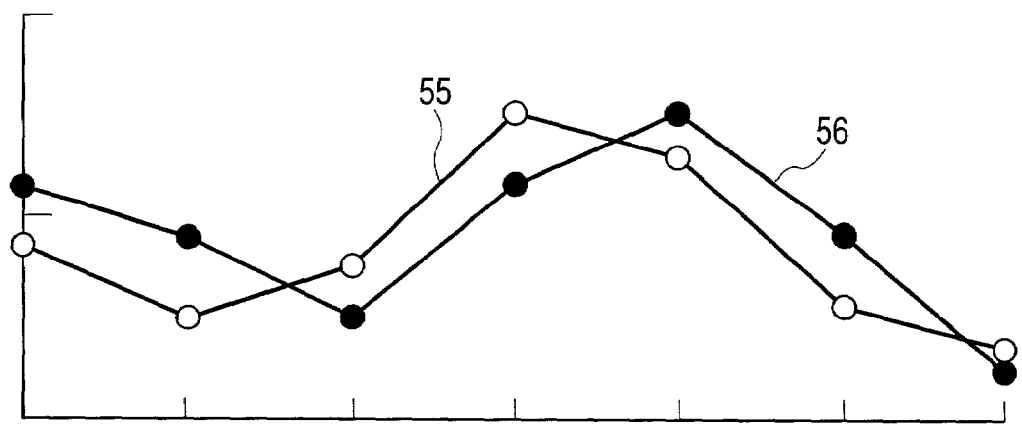
FIG. 24 is a graph showing a pair of image signals in light-receiving units having green color filters in the pixel array.
Figure 25:
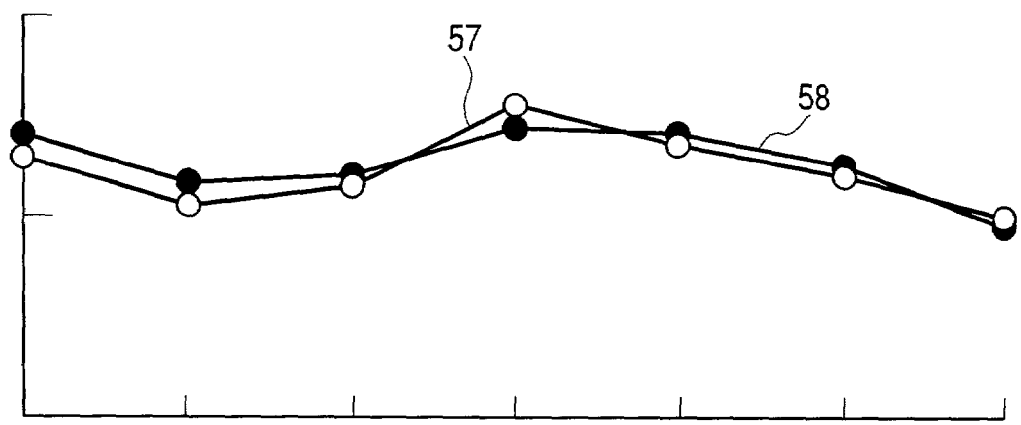
FIG. 25 is a graph showing a pair of image signals in light-receiving units having red color filters in the pixel array.
Figure 26:
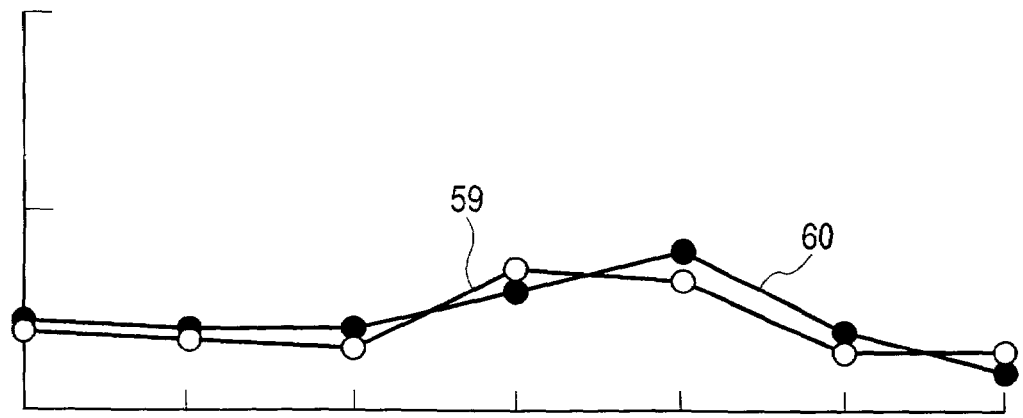
FIG. 26 is a graph showing a pair of image signals in light-receiving units having blue color filters in the pixel array.

For one focus detection region, a substantially uniform accumulation time is set. FIGS. 23 to 26 show the four pairs of image signals. FIG. 23 shows a pair of image signals from every other pixel having a green color filter in the pixel array 51. A hollow dot plot 53 indicates signals from the first photoelectric conversion units represented by G1, and solid dot plot 54 indicates signals from the second photoelectric conversion units represented by G2. Similarly, FIG. 24 shows a pair of image signals from every other pixel having a green color filter in the pixel array 52, FIG. 25 shows a pair of image signals from every other pixel having a red color filter in the pixel array 51, and FIG. 26 shows a pair of image signals from every other pixel having a blue color filter in the pixel array 52. Hollow dot plots 55, 57, and 59 indicate image signals by the first photoelectric conversion units, and solid dot plots 56, 58, and 60 indicate image signals by the second photoelectric conversion units.

In this example, the object image formed on the focus detection region 37 by the image pickup optical system is a grayscale image of orange and yellow. Green shown in FIGS. 23 and 24 has a high contrast, red shown in FIG. 25 has a low contrast but a high intensity, and blue shown in FIG. 26 has low contrast and intensity. FIGS. 23 to 26 show a state wherein the object image defocuses. The image signal of each first photoelectric conversion unit and that of a corresponding second photoelectric conversion unit have a phase shift. In addition, since the interval AL between the pair of photoelectric conversion units shown in FIGS. 8 and 9 is optimized in accordance with the F-number at the time of focus detection to improve the similarity between the pair of line spread functions, the similarity between the pairs of image signals in FIGS. 23 to 26 remains unchanged.

When the object is in an in-focus state, the image signal of each first photoelectric conversion unit and that of a corresponding second photoelectric conversion unit are in phase, and therefore, the similarity between the pair of signals is determined to allow detecting the in-focus state. That is, a defocus amount can be obtained by detecting the phase shift amount using a known method using correlation calculation. When the obtained defocus amount is converted into the drive amount of the second group grp2 of the image pickup optical system, automatic focus adjustment can be executed. Since the lens drive amount can be known in advance, the lens is driven substantially once to the in-focus position, and the focus can be adjusted at a very high speed.

In this example, color-separated signals are used. If color separation is not performed, the contrast readily becomes low, and consequently, detection is readily disabled because a signal corresponding to the sum of color components is obtained. Even when color-separated signals are used, all the R, G, and B signals need not always have a high contrast, as indicated by this example. However, a high-contrast signal is obtained in at least one of the R, G, and B signals, and therefore, focus detection can be attained in most cases.

In addition, of phase shift amounts detected from the image signals 53 and 54, phase shift amounts detected from the image signals 55 and 56, and phase shift amounts detected from the image signals 59 and 60, only reliable phase shift amounts are selected and averaged, thereby obtaining higher focus detection accuracy. For example, focus detection results of low-contrast signals as in FIGS. 25 and 26 are not used for focus adjustment.

With the above arrangement, the image pickup apparatus of the present invention can realize both focus detection using the phase difference scheme and image pickup by the solid-state image pickup element 100. In addition, the image pickup apparatus can obtain a pair of image signals having a high similarity from small to large defocus in focus detection and therefore realize accurate and quick focus detection. At the time of image pickup, a high-quality image signal without any unnatural blur can be obtained using light components from the entire exit pupil of the image pickup optical system.

In this embodiment, the description has been provided for the solid-state image pickup element 100 having a pair of photoelectric conversion units formed by vertically separating a pixel unit. However, even when a pixel unit is separated in the horizontal direction, the above effects can be obtained as long as the crosstalk of the photoelectric conversion unit sensitivity distributions occurs in the phase shift direction.

In the second embodiment, the solid-state image pickup element 100 of the first embodiment is improved such that pixel units each having a pair of photoelectric conversion units separated in the vertical direction and pixel units each having a pair of photoelectric conversion units separated in the horizontal direction are present. With this arrangement, the degree of blur of an obtained image can be further improved, and an image having a higher quality can be obtained.

Generally, focus detection using the phase difference scheme is advantageous in detecting the focus of a subject having contrast in the phase shift direction. However, focus detection is often impossible for an object having contrast in a direction parallel to the phase shift direction.

An arrangement in which all the pixel units of the solid-state image pickup element 100 are separated in the vertical direction, as in the first embodiment, is advantageous in detecting an object having contrast in the vertical direction, i.e., so-called a horizontal line detection can be easily attained but a vertical line detection can not attained. To the contrary, in the second embodiment, since pixels having photoelectric conversion units separated in different directions are present, both vertical line detection and horizontal line detection are realized. A description of the same parts as in the first embodiment will be omitted, including the basic optical arrangement, pupil image formation by a microlens, the internal structure of a pixel unit, and circuit arrangement.

Figure 27:
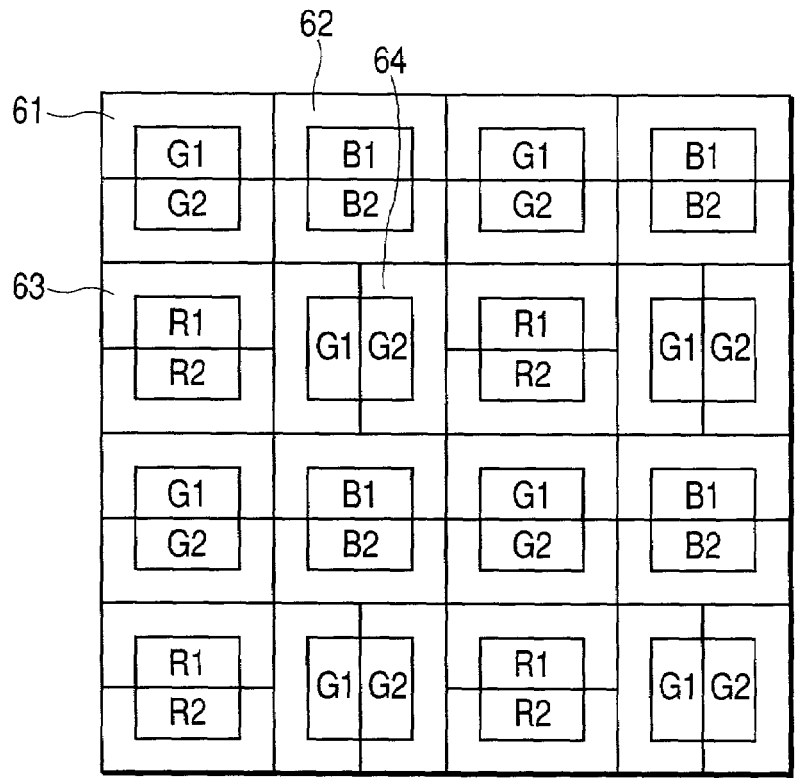
FIG. 27 is a partially enlarged schematic view showing a separated pixel array according to the second embodiment of the present invention.

FIG. 27 is an enlarged plan view showing only 4 (columns)×4 (rows) pixel units in a solid-state image pickup element 100 shown in FIG. 1, which has 1,920 (columns)×1,080 (rows) pixel units. FIG. 27 corresponds to FIG. 4 of the first embodiment.

The pixels each including a pair of photoelectric conversion units and MOS transistors are arranged in an almost square pattern and arranged in a matrix to be adjacent to each other. Each of pixels 61 to 64 has a pair of photoelectric conversion units in proximity to each other. The area sensor unit forms a so-called Bayer matrix in which R (red), G (green), and B (blue) color filters are alternately arranged on the pixels to make one set of four pixels. Symbol R, G, or B in FIG. 27 indicates that the pixel unit has a red, green, or blue color filter, and suffix 1 or 2 added to each of R, G, and B indicates distinction between the first and second photoelectric conversion units.

Since the occupation ratio of the pair of photoelectric conversion units in each pixel is low, a light beam in the entire pixel is condensed and guided to the pair of photoelectric conversion units by a microlens μL. Referring to FIG. 27, of the set of Bayer matrix pixels 61 to 64, only the pixel 64 having a green filter has photoelectric conversion units separated in the horizontal direction, and the remaining pixels 61 to 63 have photoelectric conversion units separated in the vertical direction. Hence, in the Bayer matrix formed by the set of four pixels, only one pixel having a green color filter is separated in a different direction. A vertical line can be detected using a pair of image signals by this pixel. Such a 2 (columns)×2 (rows) pixel array is repeatedly arranged in the two-dimensional region of the solid-state image pickup element 100 having 1,920 (columns)×1,080 (rows) pixels, thereby forming the area sensor unit.

For a pixel unit separated in the vertical direction, e.g., for each of the pixels 61 to 63 in FIG. 27, the pair of photoelectric conversion units projected onto the exit pupil of the image pickup optical system by the microlens μL separate the exit pupil in the same manner as in FIG. 12. Hence, sensitivity distributions in the phase shift direction of the pixel unit separated in the vertical direction cross between the pair of photoelectric conversion units, as shown in FIG. 10. On the other hand, for a pixel unit separated in the horizontal direction, e.g., for the pixel 64 in FIG. 27, it can be regarded that the pixel unit shown in the plan view of FIG. 8 in the first embodiment is rotated by 90°. Hence, sensitivity distributions in the phase shift direction are the same as in FIG. 10, and exit pupil separation is done as shown in FIG. 28 rotated from FIG. 12 by 90°.

Figure 28:
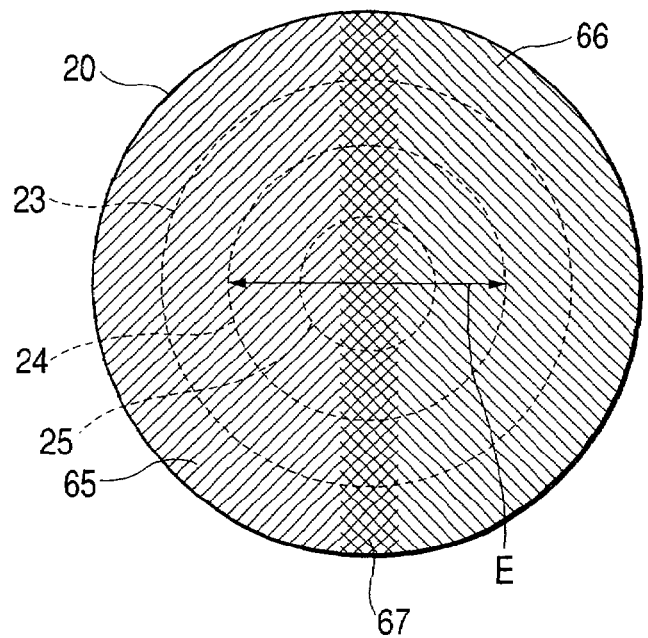
FIG. 28 is a schematic view showing exit pupil separation in the second embodiment.

The same reference numeral as in FIG. 12 of the first embodiment denote the same parts in FIG. 28. A virtual image is obtained when viewing an aperture 9 of an iris ST through rear lens groups grp3 and grp4. A hatched portion 65 with diagonal lines upward to the right indicates a first region on the exit pupil through which a light component to be incident on the first photoelectric conversion unit of the pixel unit separated in the horizontal direction in the solid-state image pickup element 100 passes. A hatched portion 66 with diagonal lines downward to the right indicates a second region on the exit pupil through which a light component to be incident on the second photoelectric conversion unit of the pixel unit separated in the horizontal direction in the solid-state image pickup element 100 passes. A double-headed arrow E indicates the direction of exit pupil separation, i.e., the direction in which a phase shift occurs between a pair of object images due to defocus. The arrow E is perpendicular to the arrow D in FIG. 12 in which a phase shift occurs. The first region 65 and second region 66 cross near a central region 67. This corresponds to the crosstalk portion at which sensitivity distributions 17 and 18 overlap in FIG. 10, i.e., a region B in FIG. 8.

As described above, independently of whether a pixel unit is separated in the vertical direction, like the pixels 61 to 63, or in the horizontal direction, like the pixel 64, a pair of line spread functions as shown in FIG. 13 (FIG. 14) can be obtained in each phase shift direction, though the phase shift directions are perpendicular to each other, and a pair of focus detection image signals having a high similarity can be obtained from small to large defocus.

In the image pickup mode in which the output signals from the pair of photoelectric conversion units are added, since the pixel unit separation directions of green color filters with high visual sensitivity in the Bayer matrix are perpendicular to each other, decreases in sensitivity indicated by a circle C in FIG. 11 are also perpendicular to each other. For this reason, a slightly unnatural blur in the phototaken image can be made unnoticeable, and an image signal with a higher quality can be obtained.

Finally, focus detection according to the second embodiment will be described.

Figure 29:
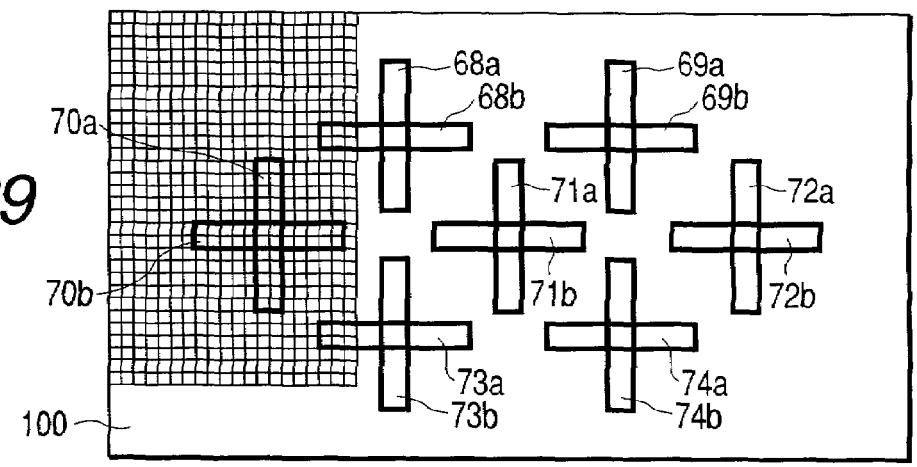
FIG. 29 is a schematic view showing focus detection regions on an image pickup element according to the second embodiment.

FIG. 29 is a view showing focus detection regions 72 to 78 preset on the solid-state image pickup element 100 in advance. Suffix a indicates a focus detection region aiming at detecting a horizontal line by pixel units separated in the vertical direction, and b indicates a focus detection region aiming at detecting a vertical line by pixel units separated in the horizontal direction. Pixels arranged in a matrix form are illustrated only near focus detection regions 74a and 74b in FIG. 29, though they are not illustrated for the remaining regions. Each focus detection region is designed to efficiently detect phase shift conversion by setting the direction in which a phase shift occurs due to exit pupil separation, to the longitudinal direction.

Figure 30:
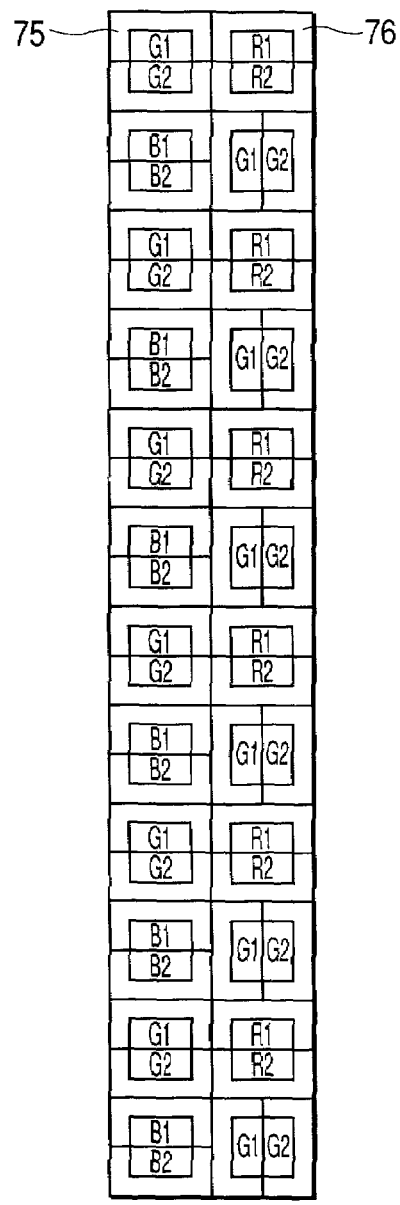
FIG. 30 is a partially enlarged schematic view showing a focus detection region.

The focus detection method in a focus detection region with suffix a, which detects a horizontal line, will be described first. FIG. 30 is an enlarged view of the focus detection region 74a. As shown in FIG. 30, the focus detection region 74a has pixel arrays 75 and 76 each formed from 12 pixel units. In fact, the focus detection region 74a is formed from a number of pixels, e.g.,300 (rows)×2 (columns) pixels. For the illustrative convenience, only 12 (rows)×2 (columns) pixel units are illustrated here. Since the focus detection region 74a is designed to detect a pair of object images having a phase shift in the vertical direction, focus detection is executed using image signals by pixel units separated in the vertical direction. Hence, as in the first embodiment, when image signals separated by the colors of the color filters are generated, a set of image signals for each of green, blue, and red, i.e., a total of three sets of image signals can be obtained.

Figure 31:
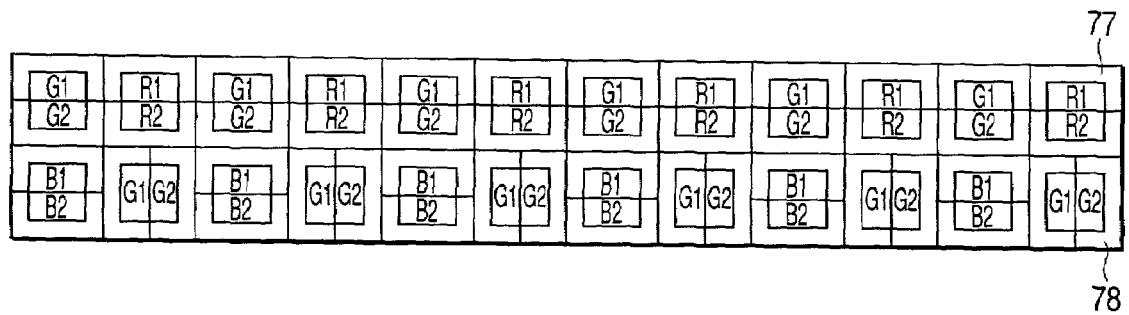
FIG. 31 is a partially enlarged schematic view showing a focus detection region.

The focus detection method in a focus detection region with suffix b, which detects a vertical line, will be described next. FIG. 31 is an enlarged view of a focus detection region 75b. The focus detection region 75b is also formed from a number of pixels, e.g.,300 (rows)×2 (columns) pixels. Since the focus detection region 75b is designed to detect a pair of object images having a phase shift in the horizontal direction, focus detection is executed using image signals by pixel units separated in the horizontal direction.

Hence, only pairs of image signals by green color filters in a pixel array 78 are obtained from the focus detection region 75b. In the Bayer matrix formed by the set of four pixels, only a pixel having a green color filter is separated in the horizontal direction due to the following reason. An object image often contains a green component when it is separated into R, G, and B, and in a practical subject image, focus detection can be almost satisfactorily executed using only the green component.

With the above arrangement, three pairs of image signals with a phase shift in the vertical direction and a pair of image signals with a phase shift in the horizontal direction are obtained. Generally, a subject image often has contrast in the vertical or horizontal direction. Even when the three pairs of image signals have low contrast, the pair of image signals contain a contrast component in many cases. For this reason, a phase shift can be detected using these image signals.

Hence, in this embodiment, focus detection of most objects can be executed, unlike the first embodiment.

In addition, since both a pixel unit separated in the vertical direction and a pixel unit separated in the horizontal direction have a crosstalk in sensitivity distributions between the pair of photoelectric conversion units, image signals optimum to the purpose such as image pickup or focus detection can be obtained.

In this embodiment, only pixels having green color filters are separated in a different direction. However, all the green, blue, and red pixels may be separated in the vertical or horizontal direction.

In an image pickup apparatus of the third embodiment, the first embodiment is improved such that a plurality of types of pixel units having different intervals ΔL between pairs of photoelectric conversion units in FIG. 8 are present.

Hence, focus detection using a plurality of F-numbers is possible. Especially, in an interchangeable lens system, when a phototaking lens with a small F-number is attached, focus detection is performed using an F-number smaller than that for normal focus detection, thereby increasing the base length of focus detection. This realizes more accurate focus detection and also improves the limit performance at a low luminance.

A description of the same parts as in the first embodiment will be omitted, including the basic optical arrangement, pupil image formation by a microlens, the internal structure of a pixel unit, and circuit arrangement. The same reference numerals as in the first embodiment denote the same members throughout the following drawings, and a description thereof will be omitted.

Figure 32:
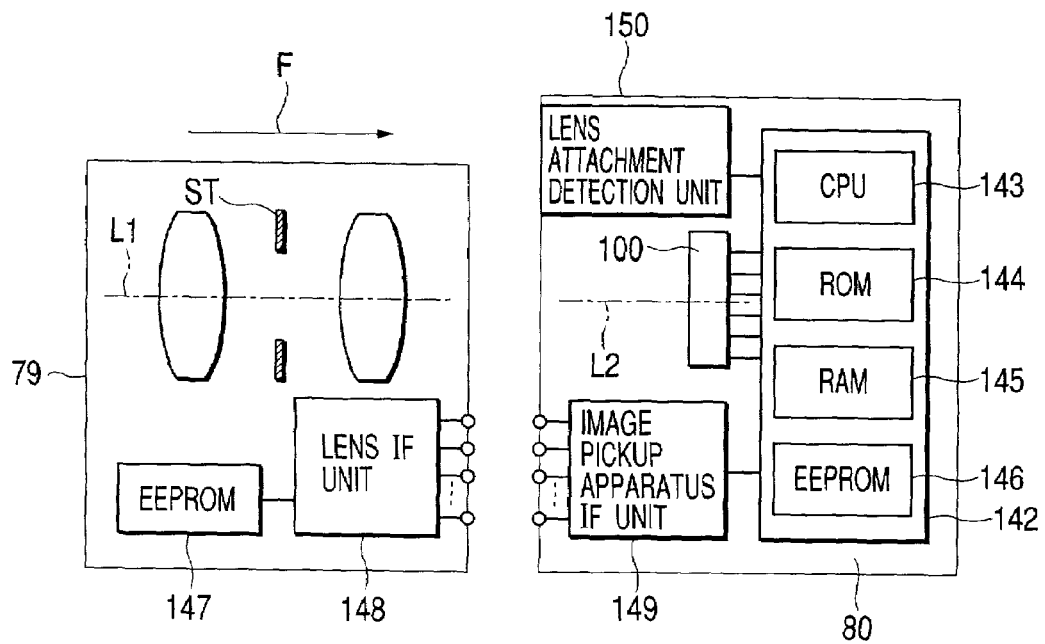
FIG. 32 is a block diagram of the electrical system in an interchangeable lens system according to the third embodiment.

FIG. 32 is a block diagram of the electrical system according to the third embodiment. FIG. 32 shows a phototaking lens 79 and image pickup apparatus 80 in an interchangeable lens system.

The phototaking lens 79 has an EEPROM 147 and lens IF unit 148. On the other had, the image pickup apparatus 80 has an image pickup apparatus IF unit 149 and lens attachment detection unit 150. With the above arrangement, the phototaking lens 79 is moved in the direction of an arrow F in FIG. 32 and fixed with respect to the image pickup apparatus 80 by a detachable lens attachment mechanism (not shown). The lens attachment detection unit 150 detects that the phototaking lens 79 has been attached. The image pickup apparatus 80 loads information and optical correction values related to the phototaking lens, which are stored in the EEPROM 147 of the phototaking lens 79 in advance, through the lens IF unit 148 and image pickup apparatus IF unit 149.

Figure 33A:
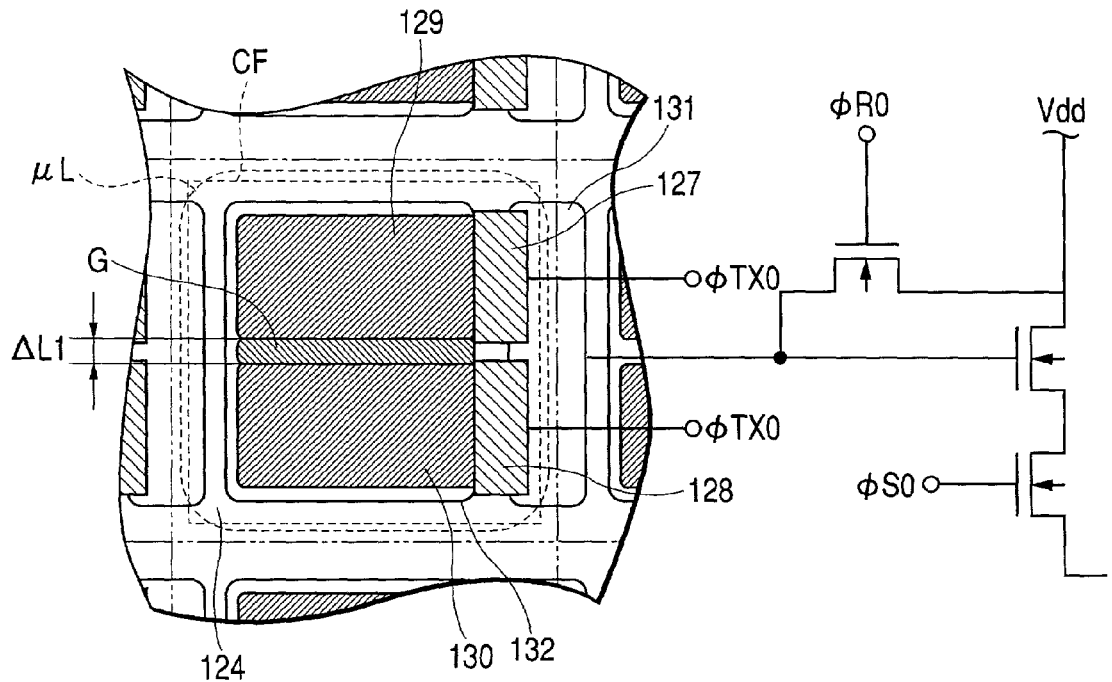
FIGS. 33A and 33B are plan views of a pixel unit of an area sensor unit according to the third embodiment of the present invention.
Figure 33B:
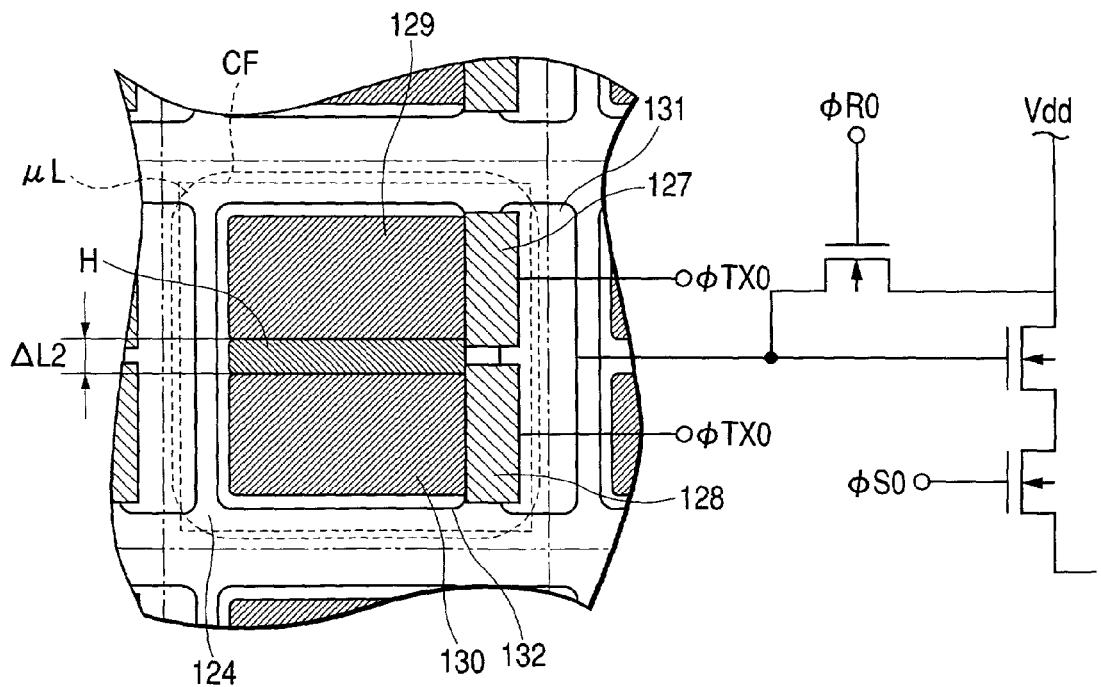

FIGS. 33A and 33B are enlarged plan views of pixel units arranged in a solid-state image pickup element 100 of this embodiment, in which two types of pixel units having different structures are present. Referring to FIGS. 33A and 33B, intervals ΔL1 and ΔL2 between n-type layers 129 and 130 of pairs of photoelectric conversion units are different from each other and have a relationship given by $$\Delta L1 < \Delta L2 \quad (4)$$

A portion including the n-type layers 129 and 130 and a region G therebetween in FIG. 33A has the same shape and area as those of a portion including the n-type layers 129 and 130 and a region H therebetween in FIG. 33B. Even in the regions G and H between the n-type layers 129 and 130, photoelectric conversion is executed, as in the first embodiment. Hence, sensitivity distributions as shown in FIG. 34 are obtained in the pixel unit separation direction in the pair of photoelectric conversion units.

Figure 34:
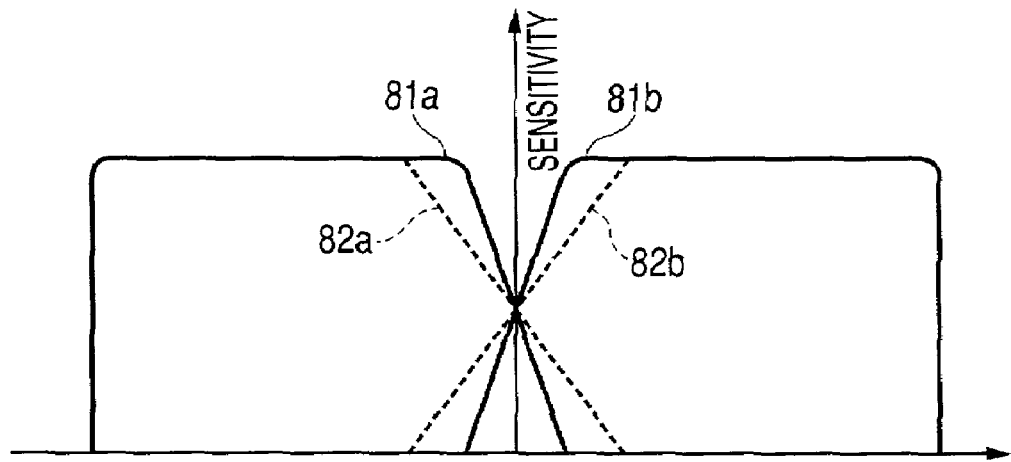
FIG. 34 is a graph showing the sensitivity distribution of a pair of photoelectric conversion units in the pixel unit shown in FIGS. 33A and 33B.

Referring to FIG. 34, a pair of sensitivity distributions 81*a* and 81*b* indicated by solid lines correspond to FIG. 33A, and a pair of sensitivity distributions 82*a* and 82*b* indicated by dotted lines correspond to FIG. 33B. The pair of sensitivity distributions overlap each other except the central portion where a crosstalk occurs. As is apparent from these drawings, the crosstalk portion at which the pair of sensitivity distributions overlap is larger for the sensitivity distributions 82*a* and 82*b* obtained when the interval between the n-type layers 129 and 130 is large.

As described in the first embodiment with reference to FIG. 14, the interval ΔL between the n-type layers 129 and 130 at which the pair of line spread functions have the highest similarity for one F-number of the image pickup optical system is limited. In the third embodiment, the intervals ΔL1 and ΔL2 between the n-type layers 129 and 130 are different from each other, and two types of pixel units having the different intervals ΔL1 and ΔL2 are present. Hence, there are two F-numbers at which the similarities between the pairs of line spread functions in the two types of pixel units become high. On the basis of relationship (4), the similarity between the pair of line spread functions is made higher for the pixel unit having the interval ΔL2 at a smaller F-number.

In this embodiment, for the pixel unit shown in FIG. 33A, the interval ΔL1 is set such that the similarity between the pair of line spread functions is maximized near an F-number, e.g., F5.6 that is satisfied by all phototaking lenses in the interchangeable lens system. For the pixel unit shown in FIG. 33B, the interval ΔL2 is set such that the similarity between the pair of line spread functions is maximized near a small F-number, e.g., F2.8 that is prepared for some phototaking lenses in the interchangeable lens system.

In this embodiment, the smallest F-number within the range wherein the amount of light incident on the pair of photoelectric conversion units and the F-number of the phototaking lens have an almost linear relationship is set to about F2.0. This F-number is smaller than the above two F-numbers in the focus detection mode. Hence, in the focus detection mode, light components from the entire exit pupil of the phototaking lens can be photoelectrically converted.

As is apparent from the above description, when a normal phototaking lens having an F-number larger than F2.8 is attached, the F-number of the phototaking lens is set to F5.6, and focus detection is executed using image signals by the pixel unit shown in FIG. 33A. When a phototaking lens having an F-number equal to or smaller than F2.8 is attached, focus detection is executed using image signals by the pixel unit shown in FIG. 33B. With this operation, accurate and reliable focus detection can be executed from small to large defocus. In addition, when a phototaking lens having a small F-number of F2.8 or less is attached, focus detection can be performed using light components for the F-number of F2.8. Hence, focus detection can be executed at a higher sensitivity. Furthermore, the limit of focus detection at a low luminance can be improved.

Information about the open F-number of the phototaking lens is stored in the EEPROM 147 of the phototaking lens 79 shown in FIG. 32 in advance. When the phototaking lens is attached, the information is loaded by the image pickup apparatus side through the I/F unit. The sensitivity distribution in the image pickup mode corresponds to the sum of the pair of sensitivity distributions shown in FIG. 34.

As described in the first embodiment, for the sensitivity distribution in the separation direction in the image pickup mode, the sensitivity slightly drops between the pair of photoelectric conversion units as compared to the remaining parts. The pixel unit shown in FIG. 33B has a larger sensitivity decrease portion than the pixel unit shown in FIG. 33A because the interval ΔL2 between the pair of photoelectric conversion units is large. For this reason, an image signal in the image pickup mode also has sensitivity nonuniformity though its amount is small. In this case, when the amplification factor in an analog signal processing unit 138 of the solid-state image pickup element 100 shown in FIG. 19 is changed between the pixel units shown in FIGS. 33A and 33B, a high-quality image signal without any sensitivity non-uniformity can be obtained through the I/F unit 141.

Figure 35:
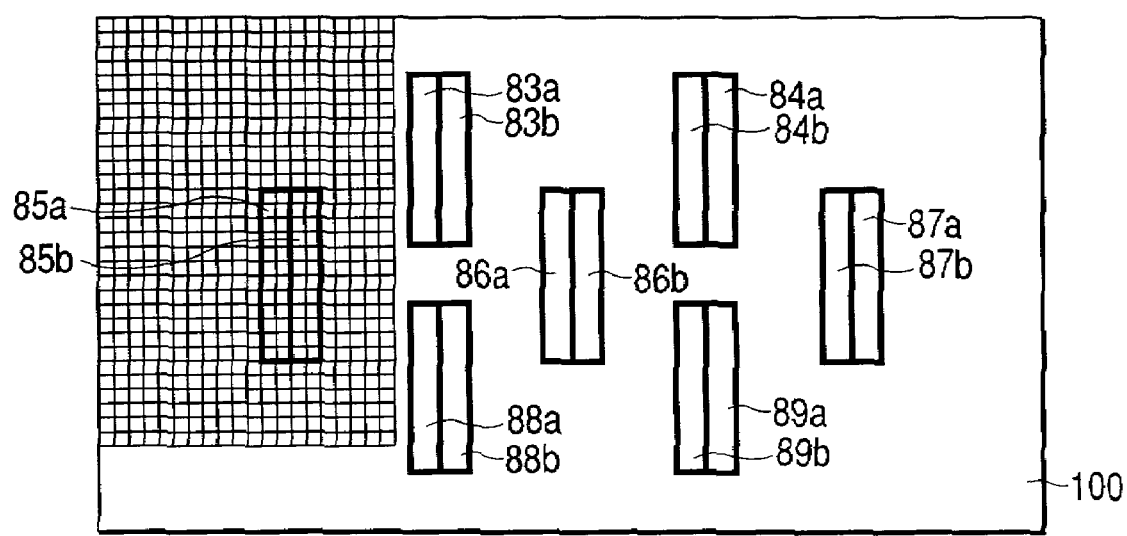
FIG. 35 is a schematic view showing focus detection regions on an image pickup element according to the third embodiment.

Finally, the phase-scheme focus detection method in this embodiment will be described. FIG. 35 is a schematic view showing focus detection regions on the solid-state image pickup element 100.

Of focus detection regions 83 to 89, a focus detection region with suffix a is formed from pixel units of the type shown in FIG. 33A, and a focus detection region with suffix b is formed from pixel units of the type shown in FIG. 33B. Pixels arranged in a matrix form are illustrated only near focus detection regions 85a and 85b in FIG. 35, though they are not illustrated for the remaining regions. Each focus detection region is designed to efficiently detect phase shift conversion by setting the direction in which a phase shift occurs due to exit pupil separation, i.e., the separation direction of the pair of photoelectric conversion units in the pixel unit, to the longitudinal direction.

Focus detection regions 83a to 89a with suffix a and focus detection regions 83b to 89b with suffix b are arranged to be adjacent to each other. In focus detection when a phototaking lens having an open F-number larger than F2.8 is attached, the F-number of the phototaking lens is set to F5.6, and focus detection image signals are formed using the focus detection regions 83a to 89a. On the other hand, in focus detection when a bright phototaking lens having an open F-number equal to or smaller than F2.8 is attached, the F-number of the phototaking lens is set to F2.8, and focus detection image signals are formed using the focus detection regions 83b to 89b. Each of the focus detection regions 83a to 89a has the same structure as in FIG. 22 of the first embodiment, i.e., has two sets of pixel arrays. For this reason, four pairs of focus detection image signals that are color separated are obtained for one focus detection region, as shown in FIGS. 23 to 26. The phase shift amount is calculated from the image signals by known correlation calculation and converted into the defocus amount of the phototaking lens, thereby realizing focus detection using the phase difference scheme.

With the above arrangement, in this embodiment, two types of focus detection regions can be selected in accordance with the open F-number of a phototaking lens, and focus detection at a smaller F-number can be executed. For this reason, focus detection can be executed by taking advantage of high sensitivity and improved limit performance at a low luminance limit for a smaller F-number. The arrangement of this embodiment copes with the basic F-number in the focus detection mode and a smaller F-number. However, an F-number larger than the basic F-number in the focus detection mode may be used.

Especially, in focus detection using the phase difference scheme in a secondary imaging optical system, generally, when the F-number of a phototaking lens is large, focus detectable regions on the image pickup surface are often limited near the optical axis of the phototaking lens. When pixel units that cope with an F-number larger than the basic focus detection F-number are prepared, focus detection can be effectively executed in a wider region on the image pickup surface even when a high-magnification zoom lens with a relatively large open F-number is attached.

Pixel units that cope with three or more types of F-numbers may be prepared to execute focus detection from small to large F-number.

In the above-described first to third embodiments, as shown in FIGS. 8 and 9, a p-type well is formed between the n-type layers 129 and 130, and a sensitivity is also imparted to this p-type well (region B) to improve the focus adjustment accuracy.

The present invention is not limited to the above arrangement. The region between the n-type layers 129 and 130 may be shielded from light, and a signal processing circuit or the like may obtain the sensitivity distribution signals as shown in FIG. 10, in which the sensitivity distributions partially overlap each other, by calculation from signals obtained by photoelectric conversion in the n-type layers 129 and 130.

In the fourth embodiment, an image pickup system in which the image pickup apparatus of any one of the first to third embodiments is applied to a still camera will be exemplified.

Figure 38:
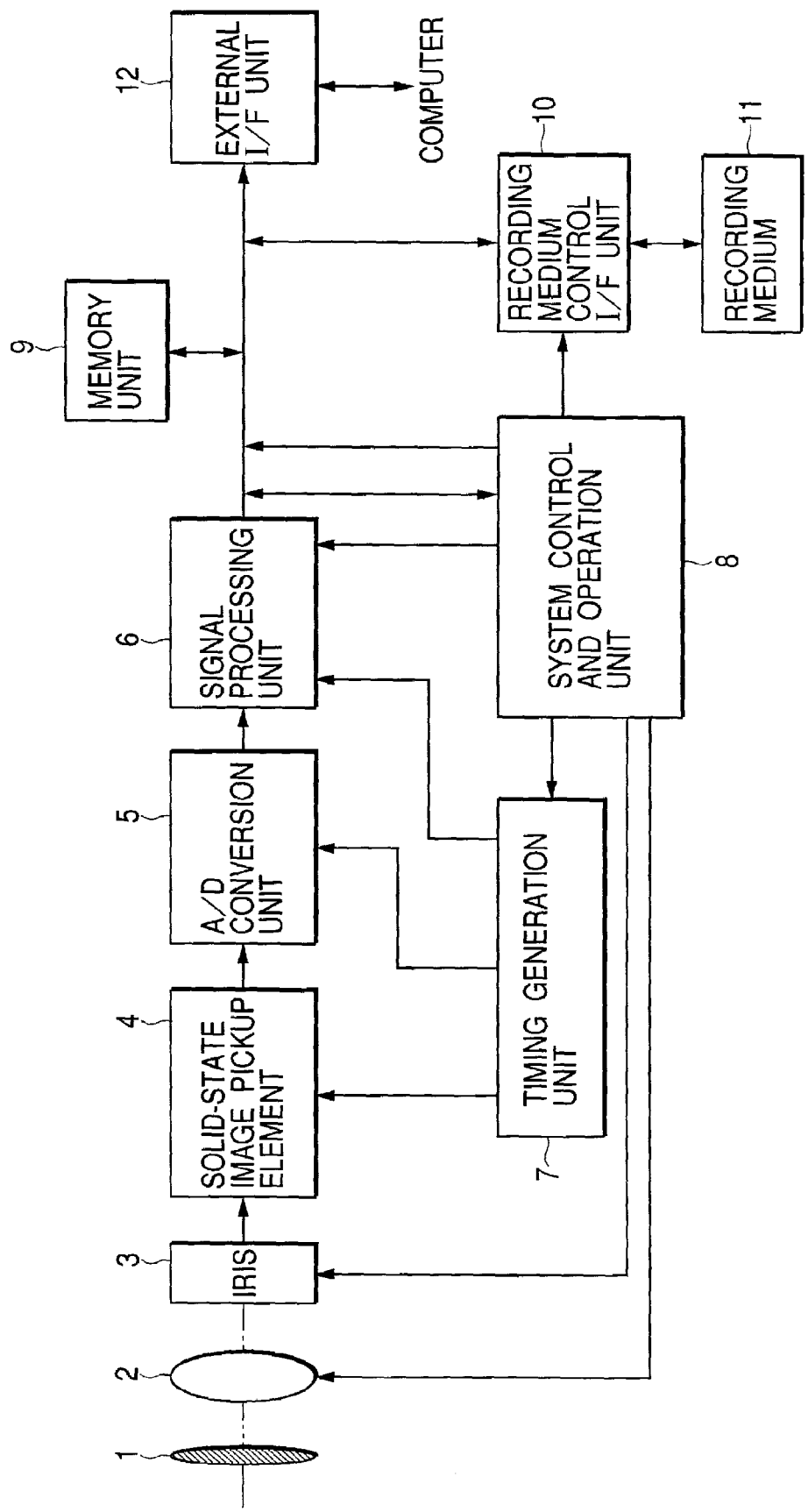
FIG. 38 is a block diagram showing the main components of a still camera according to the fourth embodiment of the present invention.
Figure 39:
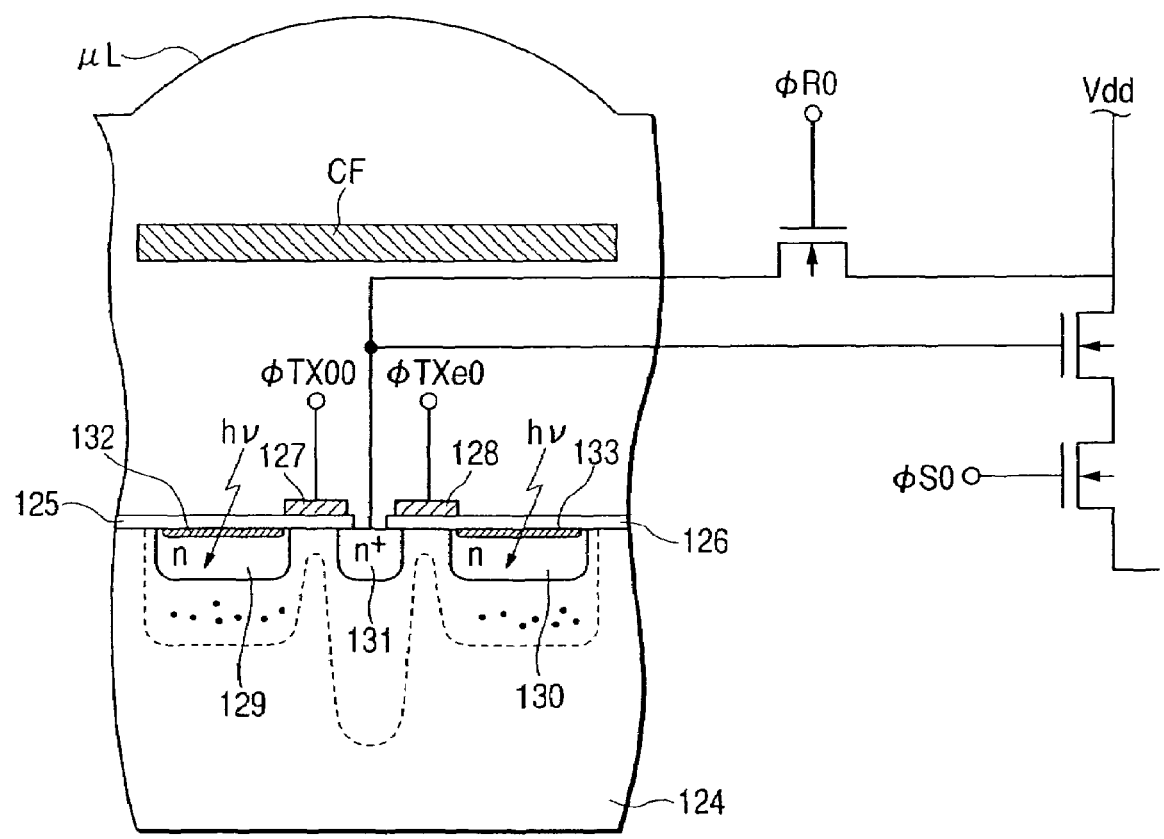
FIG. 39 is a sectional view of a pixel unit in a prior art.
Figure 40:
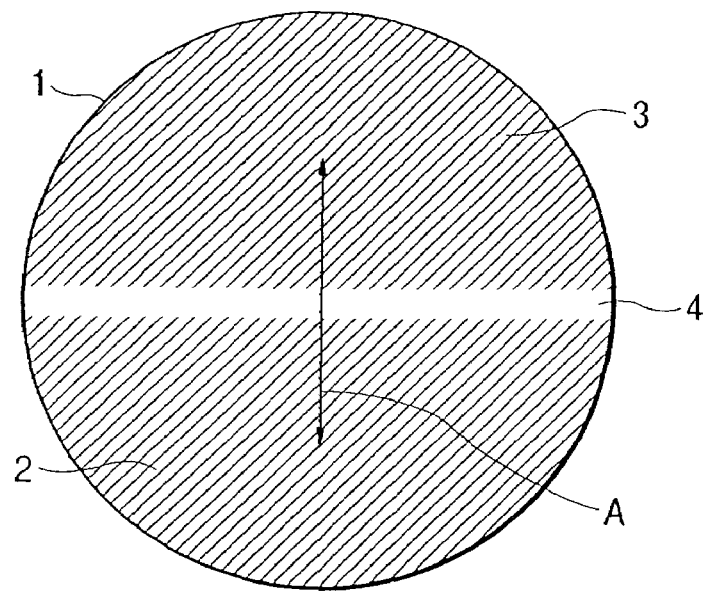
FIG. 40 is a schematic view showing exit pupil separation in the prior art.
Figure 41:
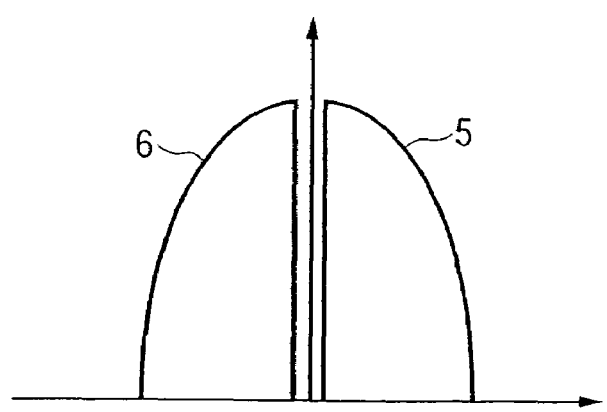
FIG. 41 is a schematic view showing a pair of pupil intensity distributions in the prior art.

FIG. 38 is a block diagram showing the main part of the still camera of this embodiment.

Referring to FIG. 38, the still camera has a barrier 1 serving as the protection and main switch of a lens, a lens 2 for forming an optical image of a subject onto a solid-state image pickup element 4, an iris 3 for changing the amount of light transmitted through the lens 2, the solid-state image pickup element 4 for receiving the subject image formed by the lens 2 as an image signal, which corresponds to the image pickup element 100 according to one of the first to third embodiments, an A/D converter 5 for executing A/D conversion of the image signal output from the solid-state image pickup element 4, a signal processing unit 6 for executing various kinds of correction operations for the image data output from the A/D converter 5 or compressing the data, a timing generation unit 7 for outputting various kinds of timing signals to the solid-state image pickup element 4, A/D converter 5, and signal processing unit 6, a system control and operation unit 8 for executing various kinds of operations and controlling the entire still camera, a memory unit 9 for temporarily storing the image data, a recording medium control interface (I/F) unit 10 for recording/reading out the image data on/from a recording medium, a detachable recording medium 11 such as a semiconductor memory for recording or reading out image data, and an external I/F unit 12 for communication with an external computer or the like.

The operation of the still camera with the above-described arrangement will be described next.

When the barrier 1 is opened, the main power supply is turned on, the power supply of the control system is turned on next, and finally, the power supply of the image pickup system circuit such as the A/D converter 5 is turned on.

To control the exposure amount, the system control and operation unit 8 sets the iris 3 in the full-aperture state. The signal output from the solid-state image pickup element 4 is converted by the A/D converter 5 and input to the signal processing unit 6. The system control and operation unit 8 executes calculation for exposure on the basis of the data. The system control and operation unit 8 determines brightness on the basis of the result of photometry, and in accordance with the result, controls the iris 3.

On the basis of the image signal output from the solid-state image pickup element 4, the distance to the object is calculated by the system control and operation unit 8. After that, the lens 2 is driven, and it is determined whether an in-focus state is obtained. If it is determined that no in-focus state is obtained, the lens 2 is driven again, and distance measurement is performed.

After confirming the in-focus state, actual exposure starts.

When exposure is ended, the image signal output from the solid-state image pickup element 4 is converted by the A/D converter 5, processed through the signal processing unit 6, and written in the memory unit 9 under the control of the system control and operation unit 8.

After that, the data stored in the memory unit 9 is recorded on the recording medium 11 through the recording medium control I/F unit 10 under the control of the system control and operation unit 8. The image data may be directly input to a computer or the like through the external I/F unit 13 to process the image.

In this embodiment, focus detection using the phase difference scheme is executed by the image pickup apparatus of one of the above embodiments. Consequently, accurate and quick focus detection can be realized. In the image pickup mode, a high-quality image signal can be obtained as in a normal solid-state image pickup element designed to photoelectrically convert all light components from the exit pupil. The still camera of this embodiment has the image pickup apparatus having the above-described effects and is therefore very reliable in realizing excellent image display.

According to the present invention, the following conspicuous technological advantages can be obtained.

(1) Since each pixel unit is designed on the basis of the F-number in the focus detection mode such that the similarity between the pair of image signals becomes high from small to large defocus, accurate and quick focus adjustment can be realized.

(2) A high-quality image with a high S/N ratio can be obtained as in a normal image pickup element designed to use all light components from the pupil of the image pickup optical system, and the unnatural image blur can almost be eliminated.

(3) Accurate and quick focus adjustment can be realized for a plurality of F-numbers from small to large defocus.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus, comprising:
   a plurality of pixels; and
   an output unit,
   wherein each pixel includes first and second photoelectric conversion portions arranged therein such that:
      an interval separates the first and second photoelectric conversion portions,
      the first photoelectric conversion portion has a first sensitivity distribution for carriers generated in a first region corresponding to the first photoelectric conversion portion and the interval, the first sensitivity distribution producing a first image component on an exit pupil of the image pickup apparatus,
      the second photoelectric conversion portion has a second sensitivity distribution for carriers generated in a second region corresponding to the second photoelectric conversion portion and the interval, the second sensitivity distribution producing a second image component on the exit pupil,
      each sensitivity distribution is a distribution of signal intensity as a function of distance, and
      the first and second sensitivity distributions partially overlap with each other, resulting in a partial overlap of the first and second image components with each other, and
   wherein the output unit receives a first electric signal and a second electric signal from each of the plurality of pixels and detects and outputs a phase difference between corresponding first and second electric signals from each of the plurality of pixels.

2. An apparatus according to claim 1, wherein the plurality of pixels includes at least two types of pixels having different separation directions of the first and second photoelectric conversion portions.

3. An apparatus according to claim 1, wherein the plurality of pixels includes at least two types of pixels having different sensitivity regions.

4. An apparatus according to claim 1, wherein the first and second sensitivity distributions are determined based on an F-number of an imaging optical system used in detection of focus.

5. An apparatus according to claim 1, wherein each of the plurality of pixels has a common amplification element adapted to amplify and output a signal from the first photoelectric conversion portion and a signal from the second photoelectric conversion portion, a first transfer switch adapted to transfer the signal from the first photoelectric conversion unit to the common amplification element, and a second transfer switch adapted to transfer the signal from the second photoelectric conversion portion to the common amplification element.

6. An apparatus according to claim 5, further comprising a drive circuit adapted to control a first mode in which the signals from the first and second photoelectric conversion portions are added by an input unit of the common amplification element and output, and a second mode in which the signals from the first and second photoelectric conversion portions are independently output from the common amplification element.

7. An apparatus according to claim 1, further comprising an A/D conversion circuit adapted to convert a signal from the image pickup element into a digital signal, and a digital signal processing circuit adapted to process the signal from the A/D conversion circuit.

* * * * *